United States Patent [19]

Onuma

[11] Patent Number: 5,323,048
[45] Date of Patent: Jun. 21, 1994

[54] MIS TYPE SEMICONDUCTOR ROM PROGRAMMED BY CONDUCTIVE INTERCONNECTS

[75] Inventor: Makoto Onuma, Osaka, Japan

[73] Assignee: Matsushita Electronics Corporation, Osaka, Japan

[21] Appl. No.: 118,699

[22] Filed: Sep. 10, 1993

Related U.S. Application Data

[63] Continuation of Ser. No. 883,440, May 15, 1992, abandoned.

[30] Foreign Application Priority Data

May 20, 1991 [JP] Japan .................................. 3-114875
May 20, 1991 [JP] Japan .................................. 3-114876

[51] Int. Cl.$^5$ ............................................. H01L 29/78
[52] U.S. Cl. ..................................... 257/390; 257/205; 257/382; 257/754
[58] Field of Search .......................... 357/23.12, 71 P; 365/104; 257/390, 205, 382, 754

[56] References Cited

U.S. PATENT DOCUMENTS

4,748,492  5/1988  Iwase et al. ..................... 357/71 P

FOREIGN PATENT DOCUMENTS

| 447976 | 9/1991 | European Pat. Off. ............. 365/104 |
| 60-9157 | 1/1985 | Japan ................................. 365/104 |
| 60-016459 | 1/1985 | Japan . |
| 60-182763 | 9/1985 | Japan . |
| 2102623 | 2/1983 | United Kingdom ................ 365/104 |

*Primary Examiner*—Robert Limanek
*Attorney, Agent, or Firm*—Lowe, Price, LeBlanc & Becker

[57] ABSTRACT

An MIS device which includes a source diffusion layer and a drain diffusion layer under the surface of a semiconductor substrate, and a plurality of gate insulation films on the surface of the semiconductor substrate. Further, a plurality of gate electrodes are formed on the plurality of gate insulation films in series with one another between the source diffusion layer and the drain diffusion layer. Moreover, inter-gate-electrode diffusion layers are formed under the surfaces of regions of the semiconductor substrate among the plurality of the gate electrodes. Insulating side walls are provided on both sides of each of the gate electrodes. Furthermore, conductive layers are provided, each for covering at least one of the inter-gate-electrode diffusion layers among the plurality of the gate electrodes and covering the insulating side walls provided on that one inter-gate-electrode diffusion layer, and filling a depression surrounded by the insulating side walls and that one inter-gate-electrode diffusion layers. An insulation layer covers the gate electrodes and the conductive layers, at least partly. A conductive wiring layer on the insulation layer is in contact with a part of the conductive layer, which is not covered by the insulation layer. The conductive layers at both sides of at least one of the gate electrodes are selectively interconnected on that gate electrode. Thus at least one of the inter-gate-electrode diffusion layers provided among the plurality of the gate electrodes, which are used in a memory cell, is covered by a conductive layer. As the result, the transconductance of an enhancement type transistor can be increased. An amplification factor and a switching speed of the enhancement type transistor can be improved. Consequently, a high-speed operation can stably be performed.

3 Claims, 10 Drawing Sheets

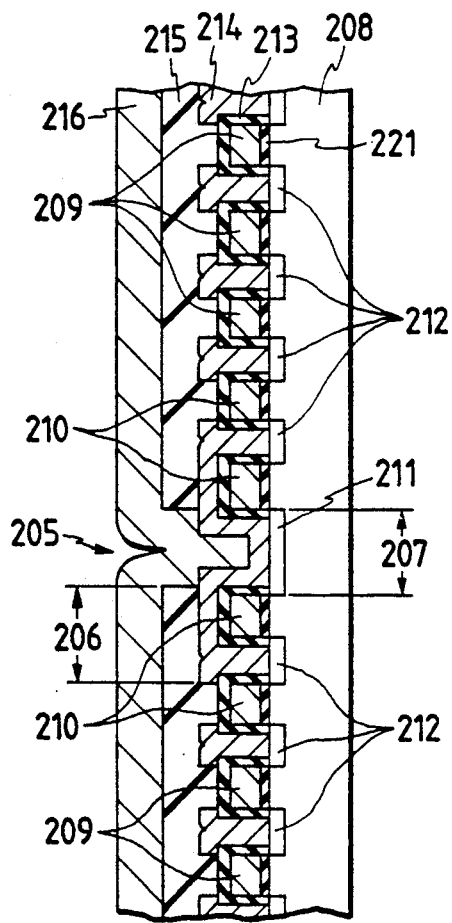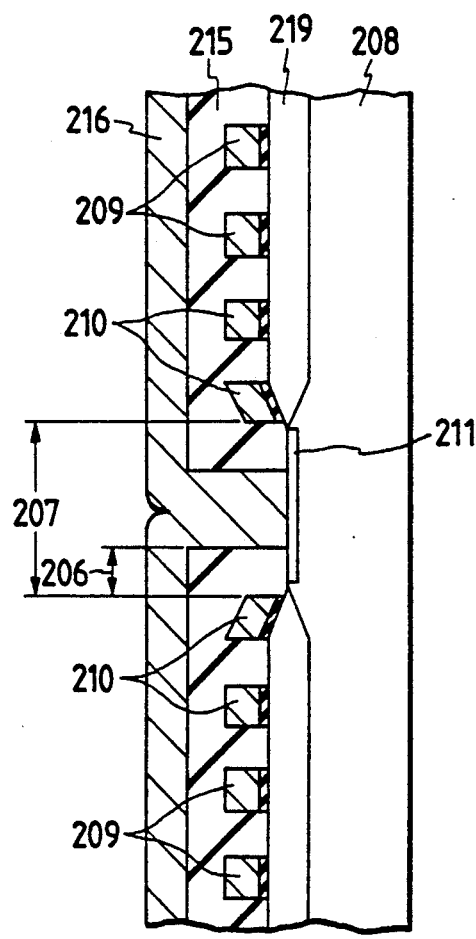
FIG. 10(b)
FIG. 11(b) PRIOR ART

MIS TYPE SEMICONDUCTOR ROM PROGRAMMED BY CONDUCTIVE INTERCONNECTS

This application is a continuation of application Ser. No. 07/883,440 filed May 15, 1992 now abandoned.

BACKGROUND OF THE INVENTION

1. Field of The Invention

This invention relates to a metal-insulation-silicon (hereunder abbreviated as MIS) type semiconductor device, which can be employed as, for example, a read-only memory, and a method for producing an MIS type semiconductor device.

2. Description of The Related Art

In recent years, there has been a marked tendency to develop a large capacity and highly-integrated semiconductor device. Moreover, there has been increased a demand for a very fine semiconductor device. Thus, a layout of a semiconductor pattern and a structure of a semiconductor device, which are more advantageous for producing a very fine semiconductor device (namely, for microminiaturizing a semiconductor device), are required. This holds true for a read-only memory.

Meanwhile, a threshold voltage of an MIS type transistor can be controlled according to the kinds and concentrations of impurities to be added to a semiconductor substrate, which is employed as a channel, in a diffusion process. In a read-only memory, information is selectively stored according to whether or not an operating threshold voltage of a gated transistor is greater than a reference voltage. An example of a conventional MIS type semiconductor device (hereunder sometimes referred to as a first conventional MIS type semiconductor device), as well as a method for producing such a conventional MIS type semiconductor device, will be described hereinbelow by referring to FIGS. 8 and 9.

FIG. 8 is a sectional view of the first conventional MIS type semiconductor device. As illustrated in this figure, the first conventional MIS type semiconductor device consists of a gate oxidation film 132 formed on a silicon substrate 131, a plurality of gate electrodes comprised of a gate-electrode polysilicon layer 133 and connected in series with one another, a source diffusion layer 134 and a drain diffusion layer 135 which are formed in the silicon substrate 131, n-type diffusion layers 136 formed between the gate electrodes, an n-type diffusion layer 139 for forming a depletion type metal-oxide semiconductor (hereunder abbreviated as DMOS) channel, an insulation layer (hereunder sometimes referred to as an inter-layer insulation film) 137 and an aluminum wire 138.

FIGS. 9(a) to 9(d) are sectional views of the first conventional MIS type semiconductor device for illustrating the method for producing the first conventional MIS type semiconductor device. Hereinafter, this method will be described by referring to these figures.

First, as shown in FIG. 9(a), a photoresist mask 140 for separating an n-type diffusion area is formed on the silicon substrate 131. Then, an n-type ion implantation is performed by shooting streams of ions 141 and using the photoresist mask 140 as a mask for the ion implantation. Thus n-type impurities are selectively diffused in the silicon substrate 131. As the result, the diffusion layer 139 for forming a DMOS channel is formed in order to control the threshold voltage of the conventional semiconductor device.

Next, as shown in FIG. 9(b), a photoresist mask 142 for forming a gate electrode is formed after the gate oxidation film 132 and the gate-electrode polysilicon layer 133 are formed.

Subsequently, as shown in FIG. 9(c), an etching of the gate-electrode polysilicon layer 133 is performed by using the photoresist mask 142 as a mask for the etching process. Then, n-type impurities are diffused by effecting an n-type ion implantation of streams of ions 143. Thus, the source diffusion layer 134, the drain diffusion layer 135 and the diffusion layers 136 are simultaneously formed.

Next, as shown in FIG. 9(d), the inter-layer insulation film 137 and the aluminum wire 138 are formed.

In the conventional MIS type semiconductor device produced as above described, the n-type diffusion layer 139 for forming a DMOS channel is present under the second gate electrode from left as viewed in FIG. 8. Thus the second transistor from left becomes a DMOS. In contrast, each of the other transistors (namely, the first, third and fourth transistors from left) is an enhancement type MOS (hereunder abbreviated as EMOS).

As is understood from the foregoing description, a read-only memory employing the first conventional MIS type semiconductor device has a structure in which data stored in a transistor thereof is discriminated as 1 or 0 according to which of DMOS and EMOS the transistor is.

A memory cell comprised of the first conventional MIS type semiconductor device constructed described above has a structure commonly called a single-layer polysilicon NAND type gate. In recent years, this structure is employed in many memory cells of mass read-only memories because of the fact that only one contact is provided therein correspondingly to a plurality of gate electrodes and thus this structure is favourable to realization of a highly integrated circuit.

Notwithstanding such an advantage, the first conventional MIS type semiconductor device and the method for producing such a conventional semiconductor device have the following drawbacks.

First, a period of time from the beginning of a programming of a read-only memory to the completion thereof is long, because the n-type diffusion layer 139 for forming a DMOS channel is formed before the gate electrodes are formed.

As a countermeasure to eliminate this drawback, it can be considered to form a diffusion layer made of impurities in a silicon substrate by performing an ion implantation posterior to the formation of the gate electrodes by accelerating ions to high velocity, which is sufficient to cause the ions to penetrate the gates. Such a countermeasure, however, has defects in that it requires an ion implantation apparatus which can accelerate ions to high energies in the range of several hundred kilo-electronvolts (KeV) to several mega-electronvolts (MeV) and in that the throughput of such an ion implantation apparatus becomes extremely low because a large quantity of ions to be accelerated is needed due to the facts that it is difficult to obtain a large beam current and that the gates hinder ions from reaching the silicon substrate.

Moreover, an ion implantation to be effected by accelerating ions to high velocity is attended with harmful effects that a device-isolation failure becomes liable to take place due to an occurrence of penetration of the n-type impurities through a device-isolation oxidation film. Thus a countermeasure to the penetration of the n-type impurities (for example, employment of trench isolation or a thick isolation oxidation film) becomes further needed.

Second, it is hard to realize a high-speed operation because the plurality of gate electrodes are arranged in series with one another and thus transistors of each memory cell cannot draw a large electric current (namely, cannot have large current driving ability).

The current flowing through the transistor of each memory cell depends on characteristics of the EMOS and DMOS transistors thereof.

Hereinafter, two respects noted by the inventor of the present invention to realize a high-speed operation of an MIS type semiconductor device will be described.

Generally, the transconductance $g_{me}$ of an MOS transistor is obtained by the following equation:

$$g_{me} = g_m/(1 + R_s \times g_m)$$

where $R_s$ denotes the resistance (hereunder sometimes referred to as the source resistance) of the source area of the MOS transistor; and $g_m$ the transconductance thereof in case where the source resistance $R_s$ is neglected.

Namely, when the source resistance $R_s$ increases, the transconductance $g_{me}$ is extremely degraded. As the result, characteristics such as an amplification factor and a switching speed of the MOS transistor are deteriorated.

In case of the device of the present invention, the characteristics of an MOS transistor can be improved by decreasing the source resistance $R_s$ of the MOS transistor.

Moreover, generally, in case where a diffusion layer made of n-type impurities is formed in a silicon substrate by an ion implantation or the like in order to form a channel of a DMOS transistor, the electrical resistance tends to decrease and the current driving ability of the DMOS transistor is apt to increase in proportion as the concentration of impurities is risen by increasing a quantity of implanted ions.

However, the elements of the impurities, of which the quantity exceeds a solid solubility limit, cannot dissolve in a silicon layer. Therefore, the quantity of the impurities, which can dissolve in a silicon layer, saturates at a certain value of the electrical resistance. It is, accordingly, difficult to make the value of the electrical resistance lower than the certain one thereof. Even if what is called an activation rate of ions of the impurities are increased, the electrical resistance can be lowered only to a specific value thereof. Instead, the diffusion layer of the impurities in the silicon layer is substantially extended as the result of an annealing or heat treatment for increasing the activation rate. This is disadvantageous to the production of a very fine memory element.

In case of the device of the present invention, the electrical resistance of an area corresponding to a channel of the DMOS transistor is lowered to have the same effects as would be obtained in case of improving the current driving ability of a DMOS transistor.

It is, therefore, an object of the present invention to provide an MIS type semiconductor device which can improve the transconductance of an enhancement type transistor thereof and characteristics of the transistors thereof to realize a high-speed operation thereof.

Further, it is another object of the present invention to provide a method, by which such an MIS type semiconductor device can stably be produced or fabricated.

Next, another example of a conventional MIS type semiconductor device (hereunder sometimes referred to as a second conventional MIS type semiconductor device), as well as a method for producing such a conventional MIS type semiconductor device, will be described hereinbelow by referring to FIGS. 11(a) and 11(b).

FIG. 11(a) is a plan view of a primary part of a layout of the second conventional MIS type semiconductor device.

FIG. 11(a) illustrates the layout of the semiconductor device comprised of a device-isolation region 201, memory-cell transistor gate electrode regions 202, selection line transistor gate electrode regions 203, an n-type diffusion region 217 for forming a DMOS channel, a drain region 218 and a contact pattern region 205 for forming a contact which touches the region 218.

Data is written to a read-only memory, which is produced by using this layout, according to which of DMOS and EMOS transistors a memory cell, to which the data is written, has correspondingly to the presence or absence of the n-type diffusion region 217.

In case of using the conventional patter layout, there is necessity of separating the layout pattern from gate electrode region by a distance of an overlapping margin 206 for forming the contact as a limit to the layout of the contact patter region 205.

This results in that the distance 207 between the selection line transistor gate electrode regions 203, which are respectively located at end portions of couples of the regions 203 upwardly and downwardly from the contact pattern region 205 as viewed in FIG. 11(a), should be more than a distance obtained by adding a length, which is twice the overlapping margin 206, to the length of the contact pattern region 205 in the vertical direction thereof as viewed in this figure.

FIG. 11(b) is a sectional view of the primary part of the layout of the second conventional MIS type semiconductor device, taken along the vertical line passing through the center of the contact pattern region 205 of FIG. 11(a). In FIG. 11(b), reference numeral 208 denotes a silicon substrate; and 219 a device-isolation oxidation film. Reference numerals 209 and 210 designate a memory-cell transistor gate electrode and a selection line transistor gate electrode 210, respectively, each of which has a gate oxidation film and a gate electrode polysilicon layer. Further, reference numeral 211 represents a drain diffusion layer formed in the silicon substrate 208; 215 an inter-layer insulation film; and 216 an aluminum wire employed as a bit line.

Incidentally, the n-type diffusion region for forming a DMOS channel and the n-type diffusion region provided between the gate electrodes are not shown in the sectional view of FIG. 11(b). However, these n-type diffusion regions are present in a portion, in which the device-isolation oxidation film 219 is not present, of the device.

Further, the overlapping margin 206 for forming the contact, as well as the distance 207 between the selection line transistor gate electrode regions 210, is shown in this sectional view.

A memory cell comprised of the second conventional MIS type semiconductor device constructed as shown in FIGS. 11(a) and 11(b) also has a structure commonly called a single-layer polysilicon NAND type gate. This conventional technique, however, has a drawback in that it is disadvantageous to fabrication of a very fine semiconductor device because an overlapping margin for forming an extra contact is required in case of fabricating a further highly integrated device.

Moreover, this conventional technique has another drawback in that the interconnection cannot stably be formed because an aspect ratio of a contact (namely, a ratio of the contact's depth to the contact's diameter) formed in a drain region and an aspect ratio of a contact formed in a source region are large.

Furthermore, this conventional technique has a further drawback in that a period of time from the beginning of a programming of a read-only memory to the completion thereof is long, because an n-type diffusion layer for forming a DMOS channel is formed before gate electrodes are formed.

Additionally, similarly as in case of the first conventional MIS type semiconductor device, the second conventional MIS type semiconductor device has still another drawback in that it is disadvantageous to a high-speed operation because a plurality of gate electrodes are arranged in series with one another in the pattern layout and thus transistors of each memory cell cannot draw a large electric current (namely, cannot have large current driving ability) which depends on characteristics of the EMOS and DMOS transistors thereof. The inventor of the present invention takes note of the two respects described above in order to realize a high-speed operation of an MIS type semiconductor device.

It is, therefore, a further object of the present invention to provide an MIS type semiconductor device which can be microminiaturized and can improve the transconductance of an enhancement type transistor thereof and can make the resistance of a region corresponding to a channel of a DMOS transistor low in order to have similar effects as obtained by improving the current driving ability of the DMOS transistor, thereby realizing a high-speed operation thereof, and which can shorten a period of time from the beginning of a programming of a read-only memory to the completion thereof.

SUMMARY OF THE INVENTION

To achieve the foregoing object and in accordance with a first aspect of the present invention, there is provided an MIS type semiconductor device (hereunder sometimes referred to as a first MIS type semiconductor device), wherein a source diffusion layer and a drain diffusion layer are formed under the surface of a semiconductor substrate, and a plurality of gate insulation films are formed on the surface of the semiconductor substrate, wherein a plurality of gate electrodes are formed on the plurality of gate insulation films in such a manner to be arranged in series with one another between the source diffusion layer and the drain diffusion layer, wherein inter-gate-electrode diffusion layers are formed under the surfaces of regions of the semiconductor substrate among the plurality of the gate electrodes insulating side walls provided on both sides of each of the gate electrodes; conductive layers each provided for covering at least one of the inter-gate-electrode diffusion layers among the plurality of the gate electrodes arranged in series with one another and covering the insulating side walls provided on the at least one of the inter-gate-electrode diffusion layers and filling a depression surrounded by the insulating side walls and the at least one of the inter-gate-electrode diffusion layers; an insulation layer for covering the gate electrodes and for covering the conductive layers partly; and a conductive wiring layer provided on the insulation layer and in contact with a part of the conductive layer, which part is not covered by the insulation layer, wherein the conductive layers provided at both sides of at least one of the plurality of the gate electrodes are selectively interconnected on at least one of the plurality of the gate electrodes.

Thus at least one of the inter-gate-electrode diffusion layers provided among the plurality of the gate electrodes, which are arranged in series with one another and used in a memory cell, is covered by a conductive layer. As the result, the transconductance of an enhancement type transistor can be increased. The characteristics such as an amplification factor and a switching speed of the enhancement type transistor can be improved. Consequently, a high-speed operation can stably be performed.

Moreover, the conductive layers provided at both sides of at least one of the plurality of the gate electrodes corresponding to depletion type transistors are selectively interconnected on at least one of the plurality of the gate electrodes. Thereby, the resistance of a part of the depletion type transistor corresponding to a channel can be made to be low. Further, the second MIS type semiconductor device can obtain the same effects as would be obtained by substantially improving the current driving ability of the depletion type transistor. The characteristics of the device can be substantially improved and stabilized. Moreover, the arrangement of the conductive layers can be determined correspondingly to information to be stored. Namely, a programming of a read-only memory is effected by forming the conductive layers. Consequently, the period of time from the beginning of the programming of the read-only memory to the completion thereof can be shortened.

Moreover, the source diffusion layer and the drain diffusion layer are covered by a conductive layer. Thereby, transistor characteristics of a memory cell comprised of the plurality of the gate electrodes arranged in series can be improved and a high-speed operation thereof can be achieved.

In accordance with a second aspect of the present invention, there is provided a semiconductor device (hereunder sometimes referred to as a seventh semiconductor device), which comprises a source diffusion layer and a drain diffusion layer formed under the surface of a semiconductor substrate, a plurality of gate insulation films formed on the surface of the semiconductor substrate, a plurality of memory-cell transistor gate electrodes and two or more selection line transistor gate electrodes, which are formed on the plurality of gate insulation films in such a manner to be arranged in series with one another between the source diffusion layer, inter-gate-electrode diffusion layers formed under the surfaces of regions of the semiconductor substrate among the plurality of the memory-cell transistor gate electrodes and the two or more selection line transistor gate electrodes, insulating side walls provided on both sides of each of the gate electrodes; conductive material layers each for covering at least one of the inter-gate-electrode diffusion layers among the plurality of the gate electrodes arranged in series with one another and covering the insulating side walls provided on the at least one of the inter-gate-electrode diffusion layers and filling a depression surrounded by the insulating side walls and the at least one of the inter-gate-electrode diffusion layers, an insulation layer for covering the gate electrodes and for covering the conductive material layers at least partly, and a conductive wiring layer provided on the insulation layer and in contact with a part of the conductive material layer, which part is not covered by the insulation layer, wherein the conductive material layers provided at both sides of at least one of the plurality of the gate electrodes are selectively interconnected on at least one of the plurality of the gate electrodes wherein one of the inter-gate-electrode diffusion layers, which is provided among the two or more selection line transistor gate electrodes, is connected to the conductive material layer which covers the one of the inter-gate-electrode diffusion layers and is connected to at least one of the source and drain diffusion layers.

Thus one of the inter-gate-electrode diffusion layers provided among the two or more selection line transistor gate electrodes is connected to at least one of the source and drain regions by a conductive material layer. Thereby, the microminiaturization and high-degree integration of a semiconductor device employed as a read-only memory can be achieved. Moreover, a high-speed operation of the semiconductor device can be realized.

In accordance with a third aspect of the present invention, there is provided a semiconductor device (hereunder sometimes referred to as an eighth semiconductor device), which comprises a source diffusion layer and a drain diffusion layer formed under the surface of a semiconductor substrate, a plurality of gate insulation films formed on the surface of the semiconductor substrate, a plurality of memory-cell transistor gate electrodes and two or more selection line transistor gate electrodes, which are formed on the plurality of gate insulation films in such a manner to be arranged in series with one another between the source and drain diffusion layers, inter-gate-electrode diffusion layers formed under the surfaces of regions of the semiconductor substrate among the plurality of the memory-cell transistor gate electrodes and the two or more selection line transistor gate electrodes, insulating side walls provided on both sides of each of the gate electrodes; conductive material layers each for covering at least one of the inter-gate-electrode diffusion layers among the plurality of the gate electrodes arranged in series with one another and covering the insulating side walls provided on the at least one of the inter-gate-electrode diffusion layers and filling a depression surrounded by the insulating side walls and the at least one of the inter-gate-electrode diffusion layers, an insulation layer for covering the gate electrodes and for covering the conductive material layers at least partly, and a conductive wiring layer provided on the insulation layer and in contact with a part of the conductive material layer, which part is not covered by the insulation layer, wherein the conductive material layers provided at both sides of at least one of the plurality of the gate electrodes are selectively interconnected on at least one of the plurality of the gate electrodes wherein the diffusion layers placed at both sides of the selection line transistor gate electrode corresponding to a selection line transistor serving as a depletion type transistor among a plurality of memory-cell transistors, each of which is comprised of the source diffusion layer, the drain diffusion layer, the inter-gate-electrode diffusion layer, the plurality of memory-cell transistor gate electrodes and the two or more selection line transistor gate electrodes, and two or more selection line transistors are covered by conductive material layers, wherein the conductive material layers are connected to each other on the selection line transistor gate electrode corresponding to the selection line transistor serving as a depletion type transistor, and wherein portions corresponding to two depletion type transistors used as the selection line transistors, between which the source or drain diffusion layer is inserted, are aligned in the direction along which a bit line extends wherein one of the inter-gate-electrode diffusion layers, which is provided among the two or more selection line transistor gate electrodes, is connected to the conductive material layer which covers the one of the inter-gate-electrode diffusion layers and is connected to at least one of the source and drain diffusion layers.

Thus the diffusion layers respectively positioned at both sides of the selection line transistor gate electrode corresponding to a selection line transistor serving as a depletion type transistor are covered by conductive material layers. Further, the conductive material layers are connected to each other on the selection line transistor gate electrode corresponding to the selection line transistor serving as a depletion type transistor. Moreover, portions corresponding to two depletion type transistors used as the selection line transistors, between which the source or drain region is inserted, are aligned in the direction along which a bit line extends. Thereby, the characteristics of the selection line transistor can be improved similarly as the depletion type transistor. Moreover, the microminiaturization and high-degree integration of a semiconductor device employed as a read-only memory can be realized due to the arrangement in which portions corresponding to two depletion type transistors used as the selection line transistors, between which the source or drain region is inserted, are aligned in the direction along which a bit line extends.

In accordance with a fourth aspect of the present invention, there is provided a semiconductor device (hereunder sometimes referred to as a ninth semiconductor device), which comprises a source diffusion layer and a drain diffusion layer formed under the surface of a semiconductor substrate, a plurality of gate insulation films formed on the surface of the semiconductor substrate, a plurality of memory-cell transistor gate electrodes formed on the plurality of gate insulation films in such a manner to be arranged in series with one another between the source and drain diffusion layers, inter-gate-electrode diffusion layers formed under the surfaces of regions of the semiconductor substrate among the plurality of the memory-cell transistor gate electrodes, insulating side walls are provided on both sides of each of the gate electrodes; conductive material layers each for covering at least one of the inter-gate-electrode diffusion layers among the plurality of the gate electrodes arranged in series with one another and covering the insulating side walls provided on the at least one of the inter-gate-electrode diffusion layers and filling a depression surrounded by the insulating side walls and the at least one of the inter-gate-electrode diffusion layers, an insulation layer for covering the gate electrodes and for covering the conductive material layers at least partly, and a conductive wiring layer provided on the insulation layer and in contact with a part of the conductive material layer, which part is not covered by the insulation layer, wherein one of the inter-gate-electrode diffusion layers, which is provided among the two or more selection line transistor gate electrodes, is connected to the conductive material layer which covers the one of the inter-gate-electrode diffusion layers and is connected to at least one of the source and drain diffusion layers, wherein the conductive material layers provided at both sides of at least one of the plurality of the gate electrodes are selectively interconnected on at least one of the plurality of the gate electrodes; wherein among a plurality of memory-cell transistors, each of which is comprised of the source region, the drain region, the inter-gate-electrode diffusion layer and the plurality of the memory-cell transistor gate electrodes, a memory-cell transistor serves as a depletion type transistor correspondingly to a program employed for a read-only memory, wherein the diffusion layers placed at both sides of the memory-cell transistor gate electrode corresponding to a memory-cell transistor serving as a depletion type transistor correspondingly to a program employed for a read-only memory among a plurality of memory-cell transistors, each of which is comprised of the source region, the drain region, the inter-gate-electrode diffusion layer, the plurality of memory-cell transistor gate electrodes, are covered by conductive material layers used for writing a program thereto, wherein the conductive material layers used for writing a program thereto are connected to each other on the memory-cell transistor gate electrode corresponding to the memory-cell transistor serving as a depletion type transistor, and wherein the conductive material layer is formed in at least one of contact portions of the source and drain region diffusion layers and is employed as a spacer for interconnection.

Thus the conductive material layers used for writing a program thereto are connected to each other on the memory-cell transistor gate electrode corresponding to the memory-cell transistor serving as a depletion type transistor. Further, the conductive material layer is formed in at least one of contact portions of the source and drain region diffusion layers and is employed as a spacer for interconnection. Thereby, the microminiaturization and high-degree integration of a read-only memory can be achieved. Moreover, the period of time from the beginning of a programming thereof to the completion thereof can be shortened. Furthermore, the aspect ratio of the contact connected to the semiconductor substrate can be reduced. Consequently, the interconnection can stably be formed. Namely, the microminiaturization of a semiconductor device, as well as the stabilization of fabrication thereof, can be achieved.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which:

FIG. 10(b) is a sectional view of a primary part of the layout of the semiconductor device of FIG. 10(a);

FIG. 11(b) is a sectional view of the primary part of the layout of the semiconductor device of FIG. 11(a).

DETAILED DESCRIPTION OF THE PREFERRED EMBODIMENTS

Hereinafter, preferred embodiments of the present invention will be described in detail by referring to the accompanying drawings.

Figure 1:
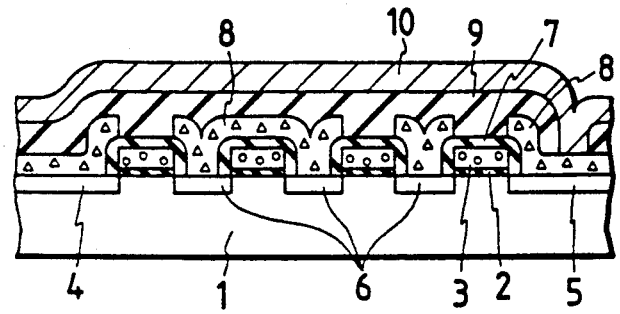
FIG. 1 is a sectional view of an MIS type semiconductor device embodying the present invention and corresponding to the first, second and third MIS type semiconductor devices.

Referring first to FIG. 1, there is shown a sectional view of an MIS type semiconductor device embodying the present invention. Incidentally, this embodiment (hereunder sometimes referred to as a first embodiment) corresponds to each of the above described first, second and third MIS type semiconductor devices.

As shown in FIG. 1, in this MIS type semiconductor device, a source diffusion layer 4 and a drain diffusion layer 5 are formed under the top surface of a silicon substrate (namely, a semiconductor substrate) 1. Further, a gate oxidation film 2, which is a gate insulation film, is formed on the silicon substrate 1. Then, a plurality of gate electrodes, each of which is made of gate electrode polysilicon 3, are formed on a part, which is inserted between the source diffusion layer 4 and the drain diffusion layer 5, of the surface of the gate insulation film 2 in such a manner to be connected with one another. Moreover, inter-gate-electrode diffusion layers 6, which are n-type diffusion layers, are formed under the surface of the silicon substrate 1. Furthermore, an insulation film 7 is formed in such a manner to cover the gate electrode. Additionally, in the device, conductive layers 8 are provided for covering the inter-gate-electrode diffusion layers 6, the source diffusion layer 4 and the drain diffusion layer 5. Further, an inter-layer insulation film 9 and an aluminum wire 10 are provided in the device.

The conductive layers 8 are connected to the inter-gate-electrode diffusion layers 6, the source diffusion layer 4 and the drain diffusion layer 5, respectively. For the purpose of forming a portion corresponding to the n-type diffusion layer 139 for forming a DMOS channel of the conventional device, the conductive layers 8, which cover the n-type diffusion layers 6 among the gate electrodes, are selectively interconnected to one another on the gate electrodes.

Further, each of the conductive layers 8 may be made of polysilicon. Alternatively, high-melting-point metals (e.g., wolfram (W), titan (Ti), molybdenum (Mo), platinum (Pt)), a silicide made of such high-melting point metals, a polycide comprised of a laminate made of such a silicide and polysilicon, or aluminum may be employed as main materials of the conductive layer 8.

In case of this embodiment, the inter-gate-electrode diffusion layers 6 formed among the plurality of the gate electrodes arranged in series with one another, which are employed in memory cells, are covered by the conductive layers 8. Thus, the transconductance of an enhancement type transistor can be increased. Further, the characteristics such as an amplification factor and a switching speed of the enhancement type transistor can be improved. A stable operation can be realized.

Moreover, the conductive layers 8, which cover the inter-gate-electrode diffusion layers 6, are selectively connected to one another on the gate electrode corresponding to a depletion type transistor. The resistance of a portion corresponding to (namely, equivalent to) a channel of the depletion type transistor can be reduced to a low value. Further, the semiconductor device can obtain the same effects as would be obtained by substantially improving the current driving ability of the depletion type transistor. Namely, the characteristics of the device can be substantially improved and stabilized. Thus a high-speed operation of the MIS type device can be achieved stably.

Moreover, because the arrangement of the conductive layers 8 is determined according to information to be stored (namely, a programming of a read-only memory is effected by forming the conductive layers), a period of time from the beginning of the programming to the completion thereof can be shortened.

Furthermore, because the source diffusion layer 4 and the drain diffusion layer 5 are covered by the conductive layers 8, the transistor characteristics of a memory cell comprised of the plurality of the gate electrodes arranged in series with one another can be improved. A high-speed operation of the device can be achieved.

Hereinafter, practical examples of a method for fabricating an MIS type semiconductor device will be described by referring to the accompanying drawings.

FIGS. 2(a) to 2(g) are sectional views of an MIS type semiconductor device of the present invention for illustrating the steps of a first practical example of a method for fabricating the MIS type semiconductor device, which corresponds to the first fabrication method.

Figure 2A:
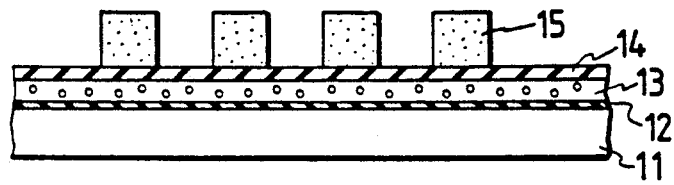
FIGS. 2(a)-(g) are a diagram for illustrating the steps of the first fabrication method for fabricating an MIS type semiconductor device of the present invention.

In case of this method for fabricating the MIS type semiconductor device, first, as illustrated in FIG. 2(a), a gate oxidation film (namely, a gate insulation film) 12 is made to grow on a silicon substrate 11. Further, a gate electrode polysilicon layer (namely, a conductive gate electrode layer) 13 is deposited on the gate oxidation film 12. Furthermore, an oxidation film (namely, a first insulation film) 14 made of a high-insulation material is deposited on the gate electrode polysilicon layer 13. Thereafter, a first photoresist 15 for forming gate electrodes are formed.

Figure 2B:
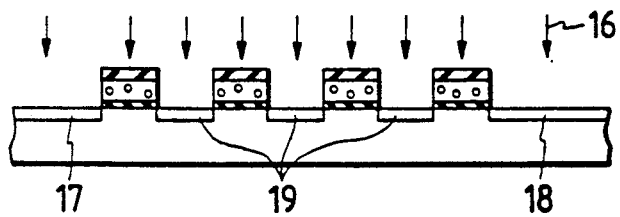

Next, as illustrated in FIG. 2(b), the oxidation film (the first insulation film) 14 is etched by using the first photoresist as a mask. Then, the gate electrode polysilicon layer 13 is etched to form the plurality of the gate electrodes between a source region and a drain region (to be changed later to a source diffusion layer and a drain diffusion layer, respectively) in such a manner to be arranged in series with one another. Moreover, the source region and the drain region of the silicon substrate 11 and regions among the plurality of the gate electrodes are exposed. Further, n-type impurities are diffused in the source region and the drain region of the silicon substrate 11 and the regions among the plurality of the gate electrodes by effecting an implantation of streams of n-type ions 16. Thus a source diffusion layer 17, a drain diffusion layer 18 and inter-gate-electrode layers 19 are formed simultaneously.

Further, a step of removing the first photoresist 15 is performed after the etching of the oxidation film (namely, the first insulation film) 14 on the gate electrode polysilicon layer 13 and before the etching of the gate electrode polysilicon layer 13. Namely, at the time of performing the etching of the gate electrode polysilicon layer 13, the photoresist 15 for forming a gate is not present. The gate electrode polysilicon layer 13 is etched by using the oxidation film 14 as a mask.

Figure 2C:
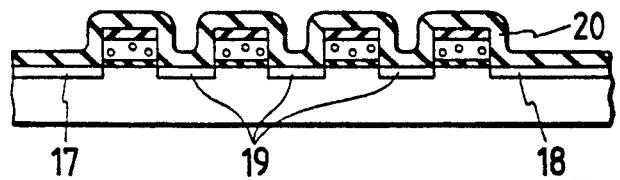

Next, as illustrated in FIG. 2(c), the oxidation film (namely, the second insulation film) 20 is deposited on the entire top surface of the device.

Figure 2D:
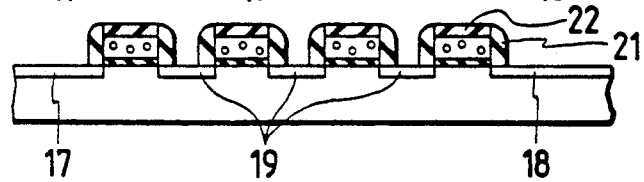

Subsequently, as illustrated in FIG. 2(d), the oxidation film (namely, the second insulation film) 20 deposited on the entire top surface of the device is etched by effecting a dry etching method so as to form side walls 21 on the sides of the plurality of the gate electrodes. At that time, the etching of the oxidation film 20 is effected on condition that the portion of the oxidation film 22 on the gate electrode polysilicon layer 13 is left, namely, is not removed.

Further, the etching is performed under the following additional conditions. Namely, the thickness of the oxidation film (namely, the second insulation film) 20 to be deposited for forming the side wall 21 is set as equal to or less than one-half of the distance between the gate electrodes. Moreover, in the step of forming the side wall 21 on the side of the gate electrode, the dry etching is performed without the photoresist used as a mask (hereunder sometimes referred to simply as the photoresist mask). Furthermore, when the etching is completed, the oxidation film 22 on the gate electrode is left as above described.

Figure 2E:
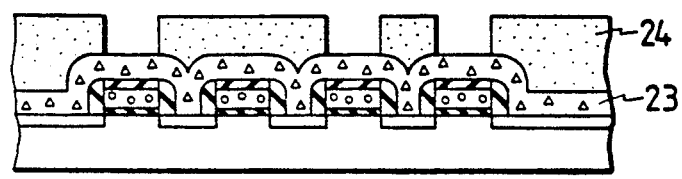

Next, as illustrated in FIG. 2(e), conductive layer 23 made of polysilicon, polycide, self-aligned silicide, aluminum or the like (incidentally, such materials are previously described in relation to FIG. 1) is deposited on the entire top surface of the device. Thereafter, the second photoresist 24 is formed on the conductive layer 23.

Figure 2F:
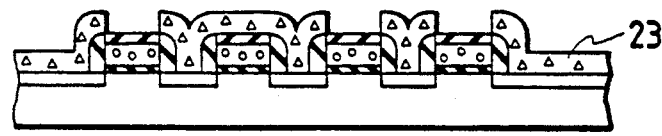

Subsequently, as illustrated in FIG. 2(f), the conductive layer 23 is etched by using the second photoresist 24 as a mask in such a manner that the remaining portions of the conductive layer 23 cover the inter-gate-electrode layer 19 provided among the plurality of the gate electrodes. Incidentally, in case of this example, the conductive layer 23 is also left on the source diffusion layer 17 and the drain diffusion layer 18. Moreover, as viewed in this figure, a portion of the conductive layer 23 is also left on, for instance, the second gate electrode from left and the remaining portion of the conductive layer serves to connect conductive layers, which cover the inter-gate-electrode diffusion layer 19 and are provided at both sides of the second gate electrode, respectively.

Figure 2G:
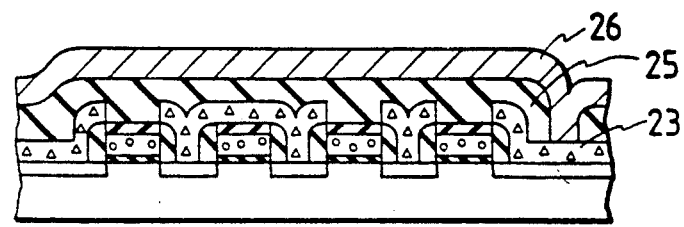

Then, as illustrated in FIG. 2(g), an inter-layer insulation film 25 and an aluminum wire 26 are formed.

In case of this example of the method for fabricating the MIS type semiconductor device, the inter-gate-electrode diffusion layers 19 formed among the plurality of the gate electrodes arranged in series with one another, which are employed in memory cells, are covered by the conductive layers 23. Thereby, the transconductance of an enhancement type transistor can be increased. Further, the characteristics such as an amplification factor and a switching speed of the enhancement type transistor can be improved. A stable operation can be realized.

Moreover, the conductive layers 23, which cover the inter-gate-electrode diffusion layers 19, are selectively connected to one another on the gate electrode corresponding to a depletion type transistor. Thereby, the resistance of a portion corresponding to a channel of the depletion type transistor can be reduced to a low value. Further, the semiconductor device can obtain the same effects as would be obtained by substantially improving the current driving ability of the depletion type transistor. Namely, the characteristics of the device can be substantially improved and stabilized. Thus a high-speed operation of the MIS type device can be achieved stably.

Moreover, the arrangement of the conductive layers 23 is determined according to information to be stored (namely, a programming of a read-only memory is effected by forming the conductive layers). As the result, a period of time from the beginning of the programming to the completion thereof can be shortened.

Furthermore, the source diffusion layer 17 and the drain diffusion layer 18 are covered by the conductive layers 23. Consequently, the transistor characteristics of a memory cell comprised of the plurality of the fate electrodes arranged in series with one another can be improved. A high-speed operation of the device can be achieved.

Additionally, as described above, the step of removing the first photoresist 15 is performed after the etching of the oxidation film (namely, the first insulation film) 14 on the gate electrode polysilicon layer 13 and before the etching of the gate electrode polysilicon layer 13. Namely, when performing the etching of the gate electrode polysilicon layer 13, the photoresist 15 is not present. The gate electrode polysilicon layer 13 is etched by using the oxidation film 14 as a mask. Thereby, in the step of etching the gate electrode polysilicon layer 13, what is called a selection ratio of the gate electrode polysilicon layer 13 to the oxidation film 14 can be improved. Thus preferable etching characteristics can be obtained. In addition, production of fine particle-like dusts from the photoresist 15 for forming a gate electrode can be suppressed. In the fabrication of the MIS type semiconductor device, the yield can be increased, and the stability can be improved.

Further, the thickness of the oxidation film 20 to be deposited for forming the side wall 21 is set as equal to or less than the distance between the gate electrodes. Thereby, characteristics of electrical conduction between the conductive layer 23 and the inter-gate-electrode diffusion layer 19, as well as characteristics of insulation between the conductive layer 23 and the gate electrode, can be improved and stabilized. Consequently, stable fabrication of the MIS type semiconductor device can be realized.

Moreover, in the step of forming the side wall 21 on the side of the gate electrode, the dry etching is performed without the photoresist mask. Thereby, fabrication costs of the MIS type semiconductor can be reduced by costs of a masking step. Moreover, what is called a selection ratio relating to the etching of the surface of the silicon substrate 11 and the oxidation film can be easily increased. Thus generation of a depression or hollow in the silicon substrate 11 can be minimized. Additionally, production of fine particle-like dusts from the photoresist can be suppressed. In the fabrication of the MIS type semiconductor device, improvements in yield and stability can be achieved.

Furthermore, the dry etching for forming the side wall 21 on the side of the gate electrode is performed on condition that when the etching is completed, the oxidation film 22 on the gate electrode is left as above described. Thereby, characteristics of the insulation between the conductive layer 23 and the gate electrode can be improved. Moreover, stable fabrication of an MIS type semiconductor device can be realized.

Referring next to FIGS. 3(a) to 3(g), there are shown sectional views of an MIS type semiconductor device of the present invention for illustrating the steps of a second practical example of a method for fabricating an MIS type semiconductor device, which corresponds to the second fabrication method.

Hereinafter, the second practical example of the method for fabricating the MIS type semiconductor device will be described by referring to FIGS. 3(a) to 3(g).

Figure 3A:
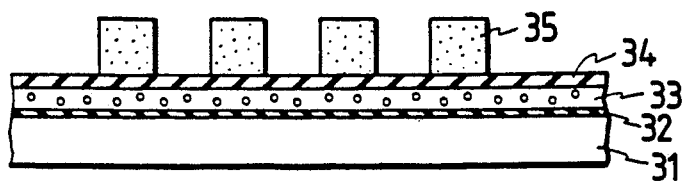
FIGS. 3(a)-(g) are a diagram for illustrating the steps of the second fabrication method for fabricating an MIS type semiconductor device of the present invention.

In case of this method for fabricating the MIS type semiconductor device, first, as illustrated in FIG. 3(a), a gate oxidation film (namely, a gate insulation film) 32 is made to grow on a silicon substrate 31. Further, a gate electrode polysilicon layer (namely, a conductive gate electrode layer) 33 is deposited on the gate oxidation film 32. Furthermore, an oxidation film (namely, a first insulation film) 34 made of a high-insulation material is deposited on the gate electrode polysilicon layer 33. Thereafter, a first photoresist 35 for forming gate electrodes are formed on the oxidation film (namely, the first insulation film) 34.

Figure 3B:
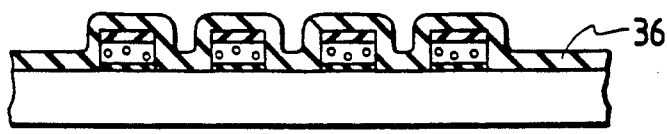

Next, as illustrated in FIG. 3(b), the oxidation film (i.e., the first insulation film) 34 is etched by using the first photoresist 35 as a mask. Then, the gate electrode polysilicon layer 33 is etched to form the plurality of the gate electrodes between a source region and a drain region (to be changed later to a source diffusion layer and a drain diffusion layer, respectively) in such a manner to be arranged in series with one another. Moreover, the source region and the drain region of the silicon substrate 31 and regions among the plurality of the gate electrodes are exposed.

Further, a step of removing the first photoresist 35 is performed after the etching of the oxidation film (namely, the first insulation film) 34 on the gate electrode polysilicon layer 33 and before the etching of the gate electrode polysilicon layer 33. Namely, at the time of performing the etching of the gate electrode polysilicon layer 33, the photoresist 35 for forming a gate is not present. The gate electrode polysilicon layer 33 is etched by using the oxidation film 34 as a mask.

Figure 3C:
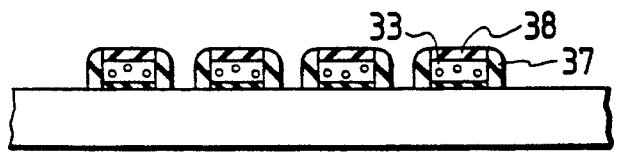

Next, after the oxidation film (namely, the second insulation film) 36 is deposited on the entire top surface of the device, as illustrated in FIG. 3(c), the oxidation film (namely, the second insulation film) 36 deposited on the entire top surface of the device is etched to form side walls 37 on the sides of the gate electrodes. At that time, the etching of the gate electrode polysilicon layer 36 is effected on condition that the portion of the oxidation film 38 on each of the gate electrode polysilicon layers 33 is left, namely, is not removed.

Further, the etching is performed under the following additional conditions. Namely, the thickness of the oxidation film (namely, the second insulation film) 36 to be deposited for forming the side wall 37 is set as equal to or less than one-half of the distance between the gate electrodes. Moreover, in the step of forming the side wall 37 on the side of the gate electrode, the dry etching is performed without the photoresist mask. Furthermore, when the etching is completed, the oxidation film 38 on the gate electrode is left as above described.

Figure 3D:
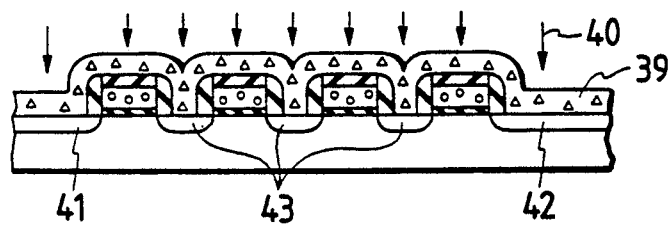

Next, as illustrated in FIG. 3(d), conductive layer 39 made of polysilicon, polycide, self-aligned silicide, or the like (incidently, such materials are previously described in relation to FIG. 1) is deposited on the entire top surface of the device. Thereafter, an ion implantation of streams of phosphorus ions 40 employed as n-type impurities is effected. Then, such n-type impurities are diffused in the source region, the drain region and regions among the plurality of the gate electrodes connected in series with one another through the conductive layer 39. Thus a source diffusion layer 41, a drain diffusion layer 42 and an inter-gate-electrode layer 43 are formed simultaneously. Incidentally, arsenic may be employed as the n-type impurity instead of phosphorus. Moreover, instead of an ion implantation, a thermal diffusion method may be employed as a method for diffusing the n-type impurities.

Figure 3E:
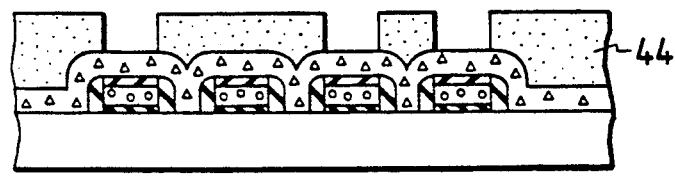

Next, as illustrated in FIG. 3(e), the second photoresist 44 is formed on the conductive layer 39 deposited on the entire top surface of the device by using a predetermined pattern.

Figure 3F:
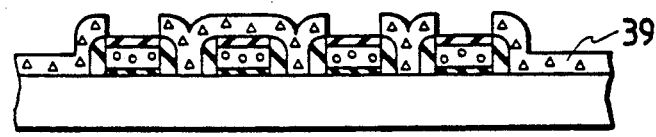

Subsequently, as illustrated in FIG. 3(f), the conductive layer 39 is etched by using the second photoresist 44 as a mask in such a manner that the remaining portions of the conductive layer 39 cover the inter-gate-electrode layer 43 provided among the plurality of the gate electrodes. Incidentally, in case of this example, the conductive layer 39 is also left on the source diffusion layer 41 and the drain diffusion layer 42. Moreover, as viewed in this figure, a portion of the conductive layer 39 is also left on, for instance, the second gate electrode from left and the remaining portion of the conductive layer serves to connect conductive layers, which cover the inter-gate-electrode diffusion layer 43 and are provided at both sides of the second gate electrode, respectively.

Figure 3G:
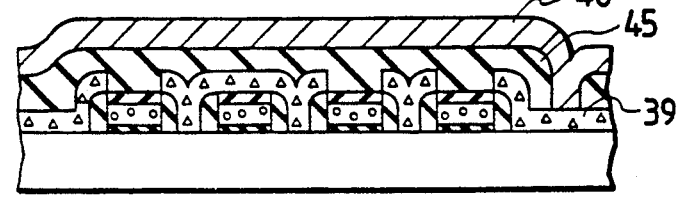

Then, as illustrated in FIG. 3(g), an inter-layer insulation film 45 and an aluminum wire 46 are formed.

In case of this example of the method for fabricating the MIS type semiconductor device, the thermal diffusion or the ion implantation of phosphorus or arsenic is employed as a method for effecting the diffusion of the n-type impurities through the conductive layer 39. Thus the forming of the source diffusion layer 41, the drain diffusion layer 42 and the inter-gate-electrode diffusion layer 43 can be performed simultaneously with the realization of a low resistance of the gate electrode polysilicon layer 32. Consequently, the fabrication of an MIS type semiconductor device can be stably performed at a low cost.

Incidentally, in case of the second practical example, the same effects as obtained in case of the first practical example described by referring to FIG. 2 can be obtained.

Turning to FIGS. 4(a) to 4(h) are sectional views of an MIS type semiconductor device of the present invention for illustrating the steps of a third practical example of a method for fabricating the MIS type semiconductor device, which corresponds to the third fabrication method.

Figure 4A:
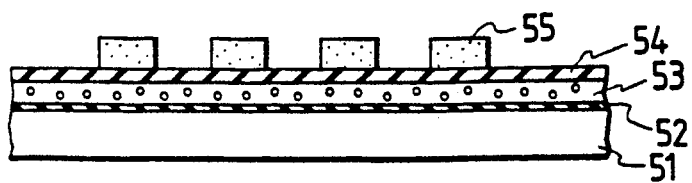
FIGS. 4(a)-(h) are a diagram for illustrating the steps of the third fabrication method for fabricating an MIS type semiconductor device of the present invention.

In case of this method for fabricating the MIS type semiconductor device, first, as illustrated in FIG. 4(a), a gate oxidation film (namely, a gate insulation film) 52 is made to grow on a silicon substrate 51. Further, a gate electrode polysilicon layer (namely, a conductive gate electrode layer) 53 is deposited on the gate oxidation film 52. Furthermore, an oxidation film (namely, a first insulation film) 54 made of a high-insulation material is deposited on the gate electrode polysilicon layer 53. Thereafter, a first photoresist 55 for forming gate electrodes are formed on the oxidation film 54.

Figure 4B:
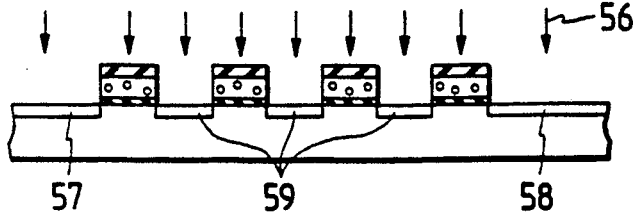

Next, as illustrated in FIG. 4(b), the oxidation film (the first insulation film) 54 is etched by using the first photoresist 55 as a mask. Then, the gate electrode polysilicon layer 53 is etched to form the plurality of the gate electrodes between a source region and a drain region (to be changed later to a source diffusion layer and a drain diffusion layer, respectively) in such a manner to be arranged in series with one another. Moreover, the source region and the drain region of the silicon substrate 51 and regions among the plurality of the gate electrodes are exposed. Further, n-type impurities are diffused in the source region and the drain region of the silicon substrate 51 and the regions among the plurality of the gate electrodes by effecting an implantation of streams of n-type ions 56. Thus a source diffusion layer 57, a drain diffusion layer 58 and inter-gate-electrode layers 59 are formed simultaneously.

Further, a step of removing the first photoresist 55 is performed after the etching of the oxidation film (namely, the first insulation film) 54 on the gate electrode polysilicon layer 53 and before the etching of the gate electrode polysilicon layer 53. Namely, at the time of performing the etching of the gate electrode polysilicon layer 53, the photoresist 55 for forming gates is not present. The gate electrode polysilicon layer 53 is etched by using the oxidation film 54 as a mask.

Figure 4C:
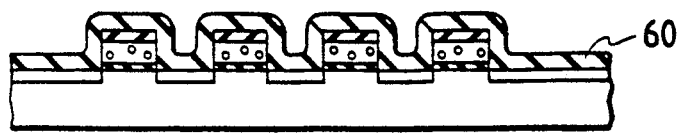

Next, as illustrated in FIG. 4(c), the oxidation film (namely, the second insulation film) 60 is deposited on the entire top surface of the device.

Figure 4D:
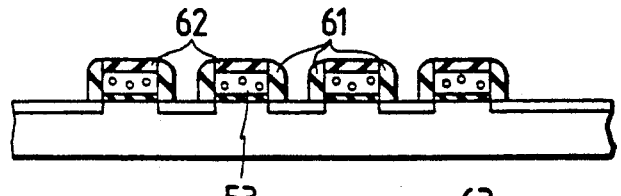

Subsequently, as illustrated in FIG. 4(d), the oxidation film (namely, the second insulation film) 60 deposited on the entire top surface of the device is etched by effecting a dry etching method so as to form side walls 61 on the sides of the plurality of the gate electrodes. At that time, the etching of the oxidation film 60 is effected on condition that the portion of the oxidation film 62 on the gate electrode polysilicon layer 53 is not removed.

Further, the etching is performed under the following additional conditions. Namely, the thickness of the oxidation film (namely, the second insulation film) 60 to be deposited for forming the side wall 61 is set as equal to or less than one-half of the distance between the gate electrodes. Moreover, in the step of forming the side wall 61 on the side of the gate electrode, the dry etching is performed without the photoresist mask. Furthermore, when the etching is completed, the oxidation film 62 on the gate electrode is left.

Figure 4E:
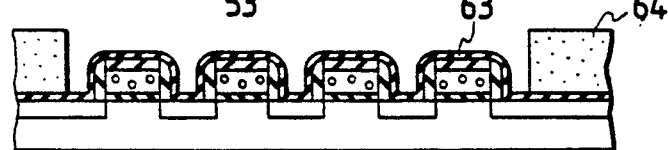

Next, as illustrated in FIG. 4(e), a silicon nitride film (namely, a third insulation film) 63 is deposited on the entire top surface of the device. Thereafter, the second photoresist 64 is formed on the source and drain regions by being separated from an outermost one of the plurality of the gate electrodes arranged in series with one another by a predetermined distance.

Here, it is made a condition that the thickness of the silicon nitride film 63, which is an insulation film deposited after the side walls 61 are formed, should be less than a value obtained by subtracting the value of the thickness of the oxidation film 60, which is an insulation film deposited to form the side walls 61, from one-half of the distance between the gate electrodes. Further, in the step of forming the second photoresist 64 on the source and drain regions by being separated from an outermost one of the plurality of the gate electrodes by a predetermined distance, the distance between the gate electrode and the second photoresist 64 is set as equal to or longer than 0.2 microns ($\mu$m).

Figure 4F:
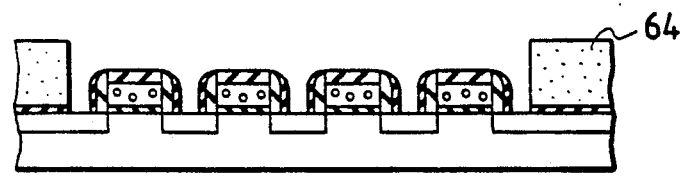

Subsequently, as illustrated in FIG. 4(f), the silicon nitride film (i.e., the third insulation film) 63 is etched by performing a dry etching method by using the second photoresist 64 as a mask. Thus portions covered by the second photoresist 64 are further covered by the silicon nitride film (i.e., the third insulation film) 63. Moreover, a part of each of the source diffusion layer 57, the drain diffusion layer 58 and the inter-gate-electrode diffusion layers 59 becomes exposed.

Figure 4G:
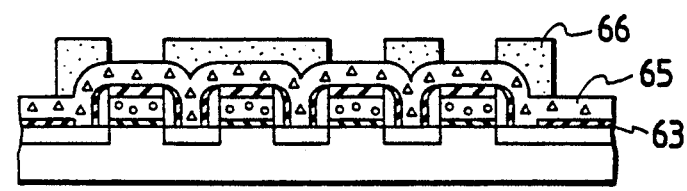

Next, as illustrated in FIG. 4(g), a conductive layer 65 made of polysilicon, polycide, self-aligned silicide, aluminum or the like (incidentally, such materials are previously described in relation to FIG. 1) is deposited on the entire top surface of the device. Thereafter, a third photoresist 66 is formed on the conductive layer 65.

Figure 4H:
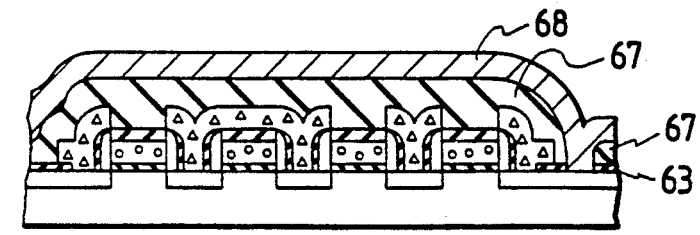

Subsequently, as illustrated in FIG. 4(h), the conductive layer 65 is etched by using the third photoresist 66 as a mask in such a manner that the remaining portions of the conductive layer 65 cover the inter-gate-electrode layer 59 provided among the plurality of the gate electrodes. Incidentally, in case of this example, the conductive layer 65 is also left on the source diffusion layer 57 and the drain diffusion layer 58. Moreover, as viewed in this figure, a portion of the conductive layer 65 also remains on, for instance, the second gate electrode from left and the remaining portion of the conductive layer serves to connect conductive layers, which cover the inter-gate-electrode diffusion layer 59 and are provided at both sides of the second gate electrode, respectively.

Thereafter, an inter-layer insulation film 67 and an aluminum wire 68 are formed.

In case of this example of the method for fabricating the MIS type semiconductor device, after the silicon nitride film (i.e., the third insulation film) 63 is deposited on the top surface of the device, the silicon nitride film 63 is etched by using the second photoresist 64 as a mask. Thus portions of the device other than memory cells come to have the silicon nitride film (i.e., the third insulation film) 63 as an inter-layer film on the silicon substrate 51. Thereby, the resistance (namely, the resisting property) of transistors, which are used in the neighborhood of a memory cell, to oxidation and hot carriers can be increased. Moreover, when a complementary metal-oxide-semiconductor (CMOS) device is fabricated, preferable characteristics of a contact resistance to the source and drain diffusion layers of a P-channel transistor region can be obtained. Consequently, an MIS type semiconductor device can stably be fabricated.

Further, as above described, the silicon nitride film is etched by forming the second photoresist 64 in such a manner to be separated from outermost ones of the plurality of the gate electrodes by a predetermined distance, which is set as equal to or longer than 0.2 $\mu$m.

Thereby, preferable characteristics of electrical conduction among the source diffusion layer 57 and the drain diffusion layer 58 of the memory cell and the conductive layer 65 can be obtained. As the result, an MIS type semiconductor device can stably be fabricated.

In addition, in case of the third practical example, the same effects as obtained in case of the first practical example described by referring to FIG. 2 can be obtained.

Referring next to FIGS. 5(a) to 5(h) are sectional views of an MIS type semiconductor device of the present invention for illustrating the steps of a fourth practical example of a method for fabricating the MIS type semiconductor device, which corresponds to the fourth fabrication method.

Figure 5A:
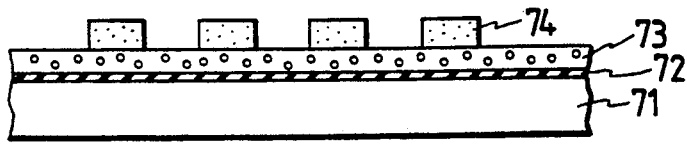
FIGS. 5(a)-(h) are a diagram for illustrating the steps of the fourth fabrication method for fabricating an MIS type semiconductor device of the present invention.

In case of this method for fabricating the MIS type semiconductor device, first, as illustrated in FIG. 5(a), a gate oxidation film (namely, a gate insulation film) 72 is made to grow on a silicon substrate 71. Further, a gate electrode polysilicon layer (namely, a conductive gate electrode layer) 73 is deposited on the gate oxidation film 72. Thereafter, a first photoresist 74 for forming gate electrodes are formed on the gate electrode polysilicon layer 73.

Figure 5B:
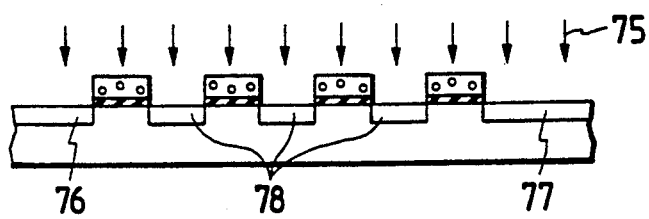

Next, as illustrated in FIG. 5(b), the gate electrode polysilicon layer 73 is etched to form the plurality of the gate electrodes between a source region and a drain region (to be changed later to a source diffusion layer and a drain diffusion layer, respectively) in such a manner to be arranged in series with one another using the first photoresist 74 as a mask. Moreover, the source region and the drain region of the silicon substrate 71 and regions among the plurality of the gate electrodes are exposed. Further, n-type impurities are diffused in the source region and the drain region of the silicon substrate 71 and the regions among the plurality of the gate electrodes by effecting an implantation of streams of n-type ions 75. Thus a source diffusion layer 76, a drain diffusion layer 77 and inter-gate-electrode layers 78 are formed simultaneously.

Figure 5C:
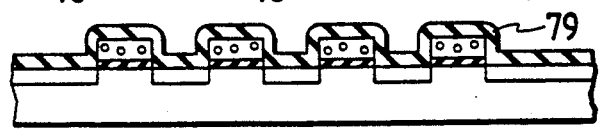

Next, as illustrated in FIG. 5(c), the oxidation film (namely, the second insulation film) 79 is deposited on the entire top surface of the device.

Figure 5D:
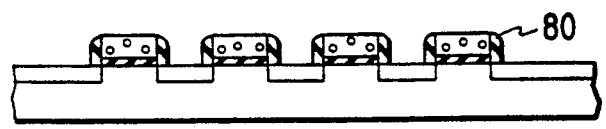

Subsequently, as illustrated in FIG. 5(d), the oxidation film (namely, the second insulation film) 79 deposited on the entire top surface of the device is etched by effecting a dry etching method so as to form side walls 80 on the sides of the plurality of the gate electrodes.

At that time, the etching of the oxidation film 79 is performed under the following conditions. Namely, the thickness of the oxidation film (namely, the second insulation film) 79 to be deposited for forming the side wall 80 is set as equal to or less than one-half of the distance between the gate electrodes. Moreover, in the step of forming the side wall 80 on the side of the gate electrode, the dry etching is performed without the photoresist mask.

Figure 5E:
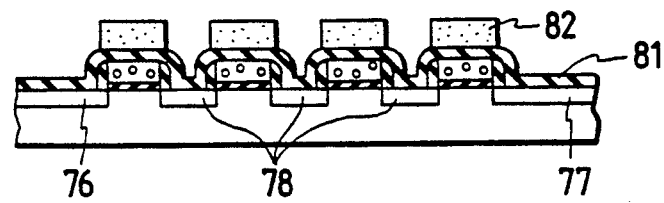

Next, as illustrated in FIG. 5(e), an oxidation film (namely, a second insulation film) 81 is deposited on the entire top surface of the device. Thereafter, a photoresist 82 having openings just above a source diffusion layer 76, a drain diffusion layer 77 and inter-gate-electrodes 78 is formed on the oxidation film (i.e., the second insulation film) 81 by using a mask which has openings just above the source diffusion layer 76, the drain diffusion layer 77 and inter-gate-electrodes 78.

Here, it is made a condition that the thickness of the oxidation film 81, which is an insulation film deposited after the first side walls 80 are formed, should be less than a value obtained by subtracting the value of the thickness of the oxidation film 79, which is an insulation film deposited to form the first side walls 80, from one-half of the distance between the gate electrodes.

Figure 5F:
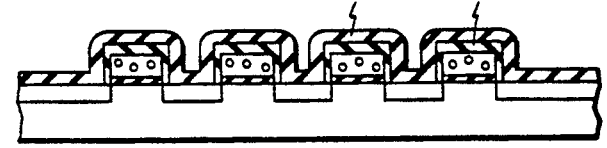

Subsequently, as shown in FIG. 5(f), the oxidation film (i.e., the second insulation film) 81 is etched by performing a dry etching method by using the photoresist 82 as a mask. Thus portions right under the photoresist 82 are covered by the oxidation film 81. Moreover, a part of each of the source diffusion layer 76, the drain diffusion layer 77 and the inter-gate-electrode diffusion layers 78 becomes exposed. Thereafter, the oxidation film (namely, the third insulation film) 83 is deposited on the entire top surface of the device.

Figure 5G:
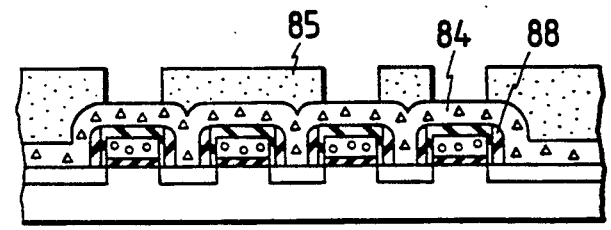

Next, as illustrated in FIG. 5(g), the oxidation film (i.e., the third insulation film) 83 deposited on the entire top surface of the device is etched by effecting a dry etching method in such a manner to form second side walls 88 on the sides of the plurality of the gate electrodes. Then, a conductive layer 84 made of polysilicon, polycide, self-aligned silicide, aluminum or the like (incidentally, such materials are previously described in relation to FIG. 1) is deposited on the entire top surface of the device. Thereafter, a third photoresist 85 is formed on the conductive layer 84 by using a mask corresponding to information to be stored.

Figure 5H:
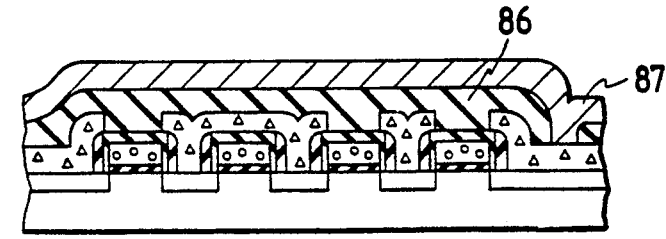

Subsequently, as illustrated in FIG. 5(h), the conductive layer 84 is etched by using the third photoresist 85 as a mask in such a manner that the remaining portions of the conductive layer 84 cover the inter-gate-electrode layer 78 provided among the plurality of the gate electrodes. Incidentally, in case of this example, the conductive layer 84 is also left on the source diffusion layer 76 and the drain diffusion layer 77. Moreover, as viewed in this figure, a portion of the conductive layer 84 also remains on, for instance, the second gate electrode from left and the remaining portion of the conductive layer 84 serves to connect conductive layers, which cover the inter-gate-electrode diffusion layer 78 and are provided at both sides of the second gate electrode, respectively.

Thereafter, an inter-layer insulation film 86 and an aluminum wire 87 are formed.

In case of this example of the method for fabricating the MIS type semiconductor device, the same effects as obtained in case of the first practical example described by referring to FIG. 2 can be obtained.

Referring next to FIGS. 6(a) to 6(i) are sectional views of an MIS type semiconductor device of the present invention for illustrating the steps of a fifth practical example of a method for fabricating the MIS type semiconductor device, which corresponds to the fifth fabrication method.

Figure 6A:
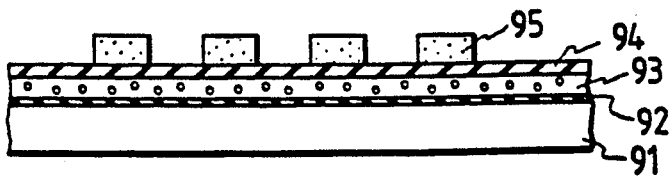
FIGS. 6(a)-(i) are a diagram for illustrating the steps of the fifth fabrication method for fabricating an MIS type semiconductor device of the present invention.

In case of this method for fabricating the MIS type semiconductor device, first, as illustrated in FIG. 6(a), a gate oxidation film (namely, a gate insulation film) 92 is made to grow on a silicon substrate 91. Further, a gate electrode polysilicon layer (namely, a conductive gate electrode layer) 93 is deposited on the gate oxidation film 92. Furthermore, an oxidation film (namely, a first insulation film) 94 made of a high-insulation material is deposited on the gate electrode polysilicon layer 93. Thereafter, a first photoresist 95 for forming gate electrodes is formed on the oxidation film 94.

Figure 6B:
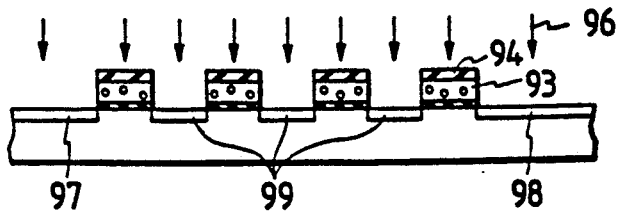

Next, as shown in FIG. 6(b), the oxidation film (namely, the first insulation film) 94 is etched by using the first photoresist 95 as a mask. Then, the gate electrode polysilicon layer 93 is etched to form the plurality of the gate electrodes between a source region and a drain region (to be changed later to a source diffusion layer and a drain diffusion layer, respectively) in such a manner to be arranged in series with one another. Moreover, the source region and the drain region of the silicon substrate 91 and regions among the plurality of the gate electrodes are exposed. Further, n-type impurities are diffused in the source region and the drain region of the silicon substrate 91 and the regions among the plurality of the gate electrodes by effecting an implantation of streams of n-type ions 96. Thus a source diffusion layer 97, a drain diffusion layer 98 and inter-gate-electrode layers 99 are formed simultaneously.

Further, a step of removing the first photoresist 95 is performed after the etching of the oxidation film (namely, the first insulation film) 94 on the gate electrode polysilicon layer 93 and before the etching of the gate electrode polysilicon layer 93. Namely, at the time of performing the etching of the gate electrode polysilicon layer 93, the photoresist 95 for forming gates is not present. The gate electrode polysilicon layer 93 is etched by using the oxidation film 94 as a mask.

Figure 6C:
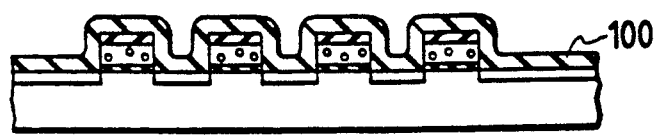

Next, as illustrated in FIG. 6(c), the oxidation film (namely, the second insulation film) 100 is deposited on the entire top surface of the device.

Figure 6D:
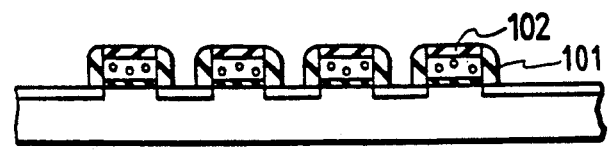

Subsequently, as illustrated in FIG. 6(d), the oxidation film (namely, the second insulation film) 100 deposited on the entire top surface of the device is etched by effecting a dry etching method so as to form side walls 101 on the sides of the plurality of the gate electrodes.

At that time, the etching of the oxidation film 100 is effected on condition that the portion of the oxidation film 102 on the gate electrode polysilicon layer 93 is not removed.

Further, the etching is performed under the following additional conditions. Namely, the etching of the oxidation film 100 is performed under the following conditions. Namely, the thickness of the oxidation film (namely, the second insulation film) 100 to be deposited for forming the side wall 101 is set as equal to or less than one-half of the distance between the gate electrodes. Moreover, in the step of forming the side wall 101 on the side of the gate electrode, the dry etching is performed without the photoresist mask. Furthermore, when the etching is completed, the oxidation film 102 on the gate electrode is left.

Figure 6E:
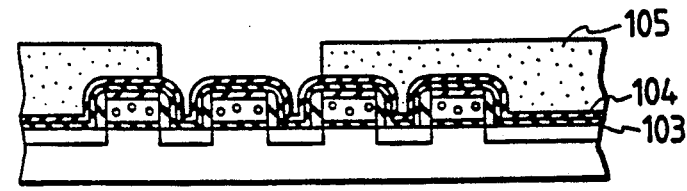

Next, as illustrated in FIG. 6(e), a silicon nitride film (namely, a third insulation film) 103, which is made of a material different from the material of the oxidation film (i.e., the second insulation film) 100, is deposited on the entire top surface of the device. Thereafter, an oxidation film (namely, a fourth insulation film) 104, which is made of a material different from the material of the silicon nitride film (namely, the third insulation film) 103, is deposited on the film 103. A second photoresist 105, which has openings just above at least two inter-gate-electrode diffusion layer 99 and gate electrodes provided therebetween, is formed by using a mask corresponding to a program code used for performing a programming of a read-only memory.

Here, it is made a condition that the thickness of each of the silicon nitride film 103 and the oxidation film 104, which are respectively third and fourth insulation films deposited after the side walls 101 are formed, should be less than a value obtained by subtracting the value of the thickness of the oxidation film 100, which is an insulation film deposited to form the side walls 101, from one-half of the distance between the gate electrodes.

Figure 6F:
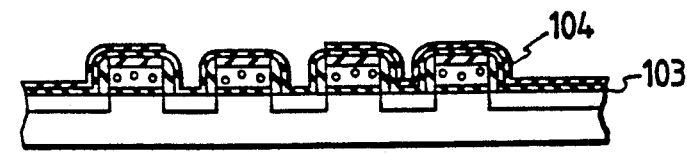

Next, as shown in FIG. 6(f), the oxidation film (a fourth insulation film) 104 is etched by using a second photoresist 105, which has an opening 105, as a mask in such a fashion that the etched oxidation film 104 has openings just above at least two adjoining inter-gate-electrode diffusion layer and the gate electrode provided therebetween.

Figure 6G:
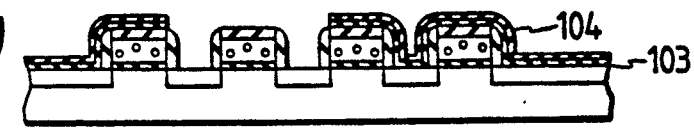
Figure 6H:
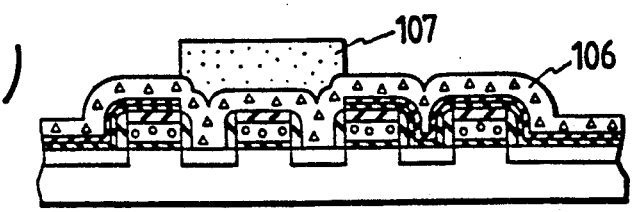

After the second photoresist 105 is removed, the silicon nitride film (namely, the third insulation film) 103 is effected as illustrated in FIG. 6(g). As the result of performing the above described steps, portions covered by the second photoresist are further covered by the silicon nitride film (namely, the third insulation film) 103 and the oxidation film 104. Further, the source diffusion layer 97, a drain diffusion layer 98 and a part of each of the inter-gate-electrode layers 99 are exposed.

Then, a conductive layer 106 made of polysilicon, polycide, self-aligned silicide, aluminum or the like (incidentally, such materials are previously described in relation to FIG. 1) is deposited on the entire top surface of the device. Thereafter, a third photoresist 107 is formed at a position corresponding to at least two adjoining inter-gate-electrode diffusion layers and the gate electrode provided on the conductive layer 106.

Figure 6I:
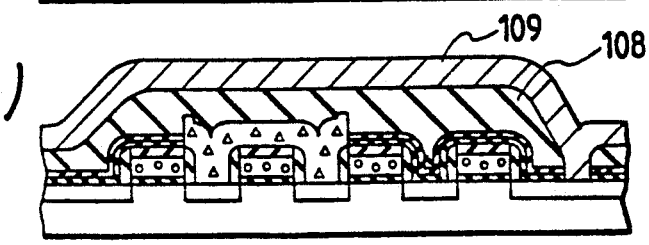

Next, as illustrated in FIG. 6(i), a portion of the conductive layer 106 is etched by using the third photoresist 107 as a mask in such a manner that the remaining portion of the conductive layer 106 is left at a position on at least two adjoining inter-gate-electrode diffusion layers and the gate electrode provided therebetween.

Thereafter, an inter-layer insulation film 108 and an aluminum wire 109 are formed.

In case of this example of the method for fabricating the MIS type semiconductor device, a part of each of the inter-gate-electrode diffusion layers 99 formed among the plurality of the gate electrodes arranged in series with one another, which are employed in memory cells, are covered by the conductive layers 106. Thereby, the transconductance of an enhancement type transistor can be increased. Further, the characteristics such as an amplification factor and a switching speed of the enhancement type transistor can be improved. A stable operation can be realized.

Furthermore, the conductive layers 106, which cover the inter-gate-electrode diffusion layers 99, are selectively connected to one another on the gate electrode corresponding to a depletion type transistor. Thereby, the resistance of a portion corresponding to a channel of the depletion type transistor can be reduced to a low value. Further, the same effects as would be obtained by substantially improving the current driving ability of the depletion type transistor can be obtained. Namely, the characteristics of the device can be substantially improved and stabilized. Thus a high-speed operation of the MIS type device can be achieved stably.

Moreover, the arrangement of the conductive layers 106 is determined according to information to be stored (namely, a programming of a read-only memory is effected by forming the conductive layers). As the result, a period of time from the beginning of the programming to the completion thereof can be shortened.

Further, a step of removing the first photoresist 95 is performed after the etching of the oxidation film (namely, the first insulation film) 94 on the gate electrode polysilicon layer 93 and before the etching of the gate electrode polysilicon layer 93. Namely, at the time of performing the etching of the gate electrode polysilicon layer 93, the photoresist 95 for forming gates is not present. The gate electrode polysilicon layer 93 is etched by using the oxidation film 94 as a mask. Thereby, in the step of etching the gate electrode polysilicon layer 93, what is called a selection ratio of the gate electrode polysilicon layer 93 to the oxidation film 94 can be improved. Thus preferable etching characteristics can be obtained. In addition, production of fine particle-like dusts from the photoresist 95 for forming a gate electrode can be suppressed. In the fabrication of the MIS type semiconductor device, the yield can be increased, and the stability can be improved.

Further, the thickness of the oxidation film 100 to be deposited for forming the side wall 101 is set as equal to or less than the distance between the gate electrodes. Thereby, characteristics of electrical conduction between the conductive layer 106 and the inter-gate-electrode diffusion layer 99, as well as characteristics of insulation between the conductive layer 106 and the gate electrode, can be improved and stabilized. Consequently, stable fabrication of the MIS type semiconductor device can be realized.

Moreover, in the step of forming the side wall 101 on the side of the gate electrode, the dry etching is performed without the photoresist mask. Thereby, fabrication costs of the MIS type semiconductor can be reduced by costs of a masking step. Moreover, what is called a selection ratio relating to the etching of the surface of the silicon substrate 91 and the oxidation film can be easily increased. Thus generation of a depression or hollow in the silicon substrate 91 can be minimized. Additionally, production of fine particle-like dusts from the photoresist can be suppressed. In the fabrication of the MIS type semiconductor device, improvements in yield and stability can be achieved.

Furthermore, the dry etching for forming the side wall 91 on the side of the gate electrode is performed on condition that when the etching is completed, the oxidation film 102 on the gate electrode is left. Thereby, characteristics of the insulation between the conductive layer 106 and the gate electrode can be improved. Moreover, stable fabrication of an MIS type semiconductor device can be realized.

Furthermore, the silicon nitride film 103, which is an insulation film, is provided in the device as an interlayer film. Thereby, the resistance (namely, the resisting property) of transistors, which are used in the neighborhood of a memory cell, to oxidation and hot carriers can be increased. Moreover, when a CMOS device is fabricated, preferable characteristics of a contact resistance to the source and drain diffusion layers of a P-channel transistor region can be obtained. Consequently, an MIS type semiconductor device can stably be fabricated.

Turning to FIGS. 7(a) to 7(h) are sectional views of an MIS type semiconductor device of the present invention for illustrating the steps of a sixth practical example of a method for fabricating the MIS type semiconductor device, which corresponds to the sixth fabrication method.

Figure 7A:
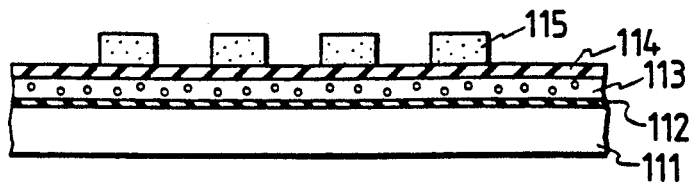
FIGS. 7(a)-(h) are a diagram for illustrating the steps of the eighth fabrication method for fabricating an MIS type semiconductor device of the present invention.

In case of this method for fabricating the MIS type semiconductor device, first, as illustrated in FIG. 7(a), a gate oxidation film (namely, a gate insulation film) 112 is made to grow on a silicon substrate 111. Further, a gate electrode polysilicon layer (namely, a conductive gate electrode layer) 113 is deposited on the gate oxidation film 112. Furthermore, an oxidation film (namely, a first insulation film) 114 made of a high-insulation material is deposited on the gate electrode polysilicon layer 113. Thereafter, a first photoresist 115 for forming gate electrodes is formed on the oxidation film 114.

Figure 7B:
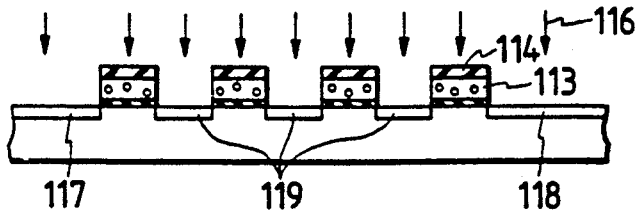

Next, as shown in FIG. 7(b), the oxidation film (namely, the first insulation film) 114 is etched by using the first photoresist 115 as a mask. Then, the gate electrode polysilicon layer 113 is etched to form the plurality of the gate electrodes between a source region and a drain region (to be changed later to a source diffusion layer and a drain diffusion layer, respectively) in such a manner to be arranged in series with one another. Moreover, the source region and the drain region of the silicon substrate 111 and regions among the plurality of the gate electrodes are exposed. Further, n-type impurities are diffused in the source region and the drain region of the silicon substrate 111 and the regions among the plurality of the gate electrodes by effecting an implantation of streams of n-type ions 116. Thus a source diffusion layer 117, a drain diffusion layer 118 and inter-gate-electrode layers 119 are formed simultaneously.

Moreover, a step of removing the first photoresist 115 is performed after the etching of the oxidation film (namely, the first insulation film) 114 on the gate electrode polysilicon layer 113 and before the etching of the gate electrode polysilicon layer 113. Namely, at the time of performing the etching of the gate electrode polysilicon layer 113, the photoresist 115 for forming gate gates is not present. The gate electrode polysilicon layer 113 is etched by using the oxidation film 114 as a mask.

Figure 7C:
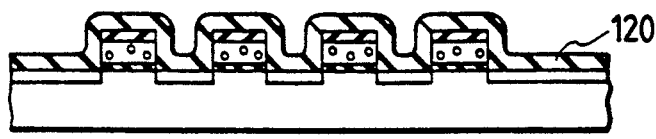

Next, as illustrated in FIG. 7(c), the oxidation film (namely, the second insulation film) 120 is deposited on the entire top surface of the device.

Figure 7D:
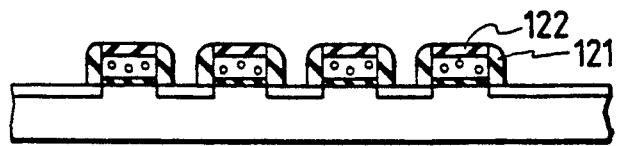

Subsequently, as illustrated in FIG. 7(d), the oxidation film (namely, the second insulation film) 120 deposited on the entire top surface of the device is etched by effecting a dry etching method so as to form side walls 121 on the sides of the plurality of the gate electrodes.

At that time, the etching of the oxidation film 121 is effected on condition that the portion of the oxidation film 122 on the gate electrode polysilicon layer 113 is not removed.

Further, the etching is performed under the following additional conditions. Namely, the etching of the oxidation film 120 is performed under the following conditions. Namely, the thickness of the oxidation film (namely, the second insulation film) 120 to be deposited for forming the side wall 121 is set as equal to or less than one-half of the distance between the gate electrodes. Moreover, in the step of forming the side wall 121 on the side of the gate electrode, the dry etching is effected without the photoresist mask. Furthermore, when the etching is completed, the oxidation film 122 on the gate electrode remains.

Figure 7E:
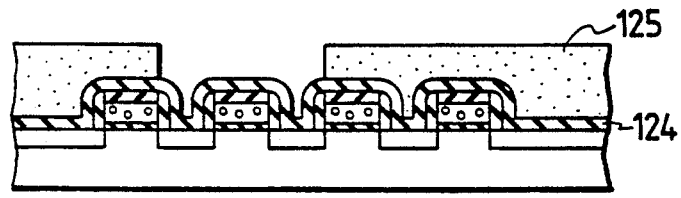

Next, as illustrated in FIG. 7(e), a silicon nitride film (namely, a third insulation film) 124 is deposited on the entire top surface of the device. Thereafter, a second photoresist 125, which has openings just above at least two inter-gate-electrode diffusion layer 119 and the gate electrode provided therebetween, is formed by using a mask corresponding to a program code used for performing a programming of a read-only memory.

Here, it is made a condition that the thickness of the silicon nitride film 124, which is a third insulation film deposited after the side walls 121 are formed, should be less than a value obtained by subtracting the value of the thickness of the oxidation film 120, which is an insulation film deposited to form the side walls 121, from one-half of the distance between the gate electrodes.

Figure 7F:
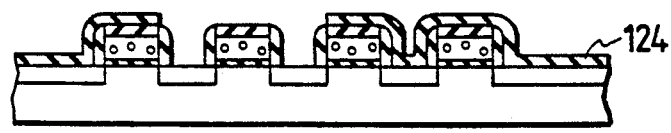

Next, as shown in FIG. 7(f), the silicon nitride film (a fourth insulation film) 124 is etched by using a second photoresist 125 as a mask in such a way that the etched silicon nitride film 124 has openings just above at least two adjoining inter-gate-electrode diffusion layer 119 and the gate electrode provided therebetween. As the result of performing the above described steps, portions covered by the second photoresist 125 are further covered by the silicon nitride film (namely, the third insulation film) 124. Further, the source diffusion layer 117, a drain diffusion layer 118 and a part of each of the inter-gate-electrode diffusion layer 119 are exposed.

Figure 7G:
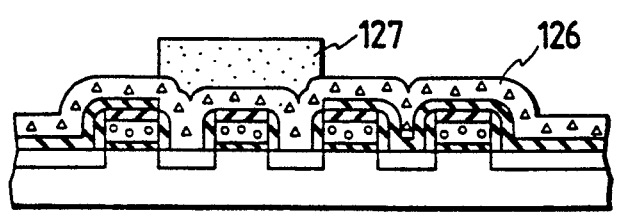

After the photoresist 125 is removed, as shown in FIG. 7(g), a conductive layer 126 made of polysilicon, polycide, self-aligned silicide, aluminum or the like (incidentally, such materials are previously described in relation to FIG. 1) is deposited on the entire top surface of the device. Thereafter, a third photoresist 127 is formed at a position corresponding to at least two adjoining inter-gate-electrode diffusion layers and the gate electrode provided on the conductive layer 126.

Figure 7H:
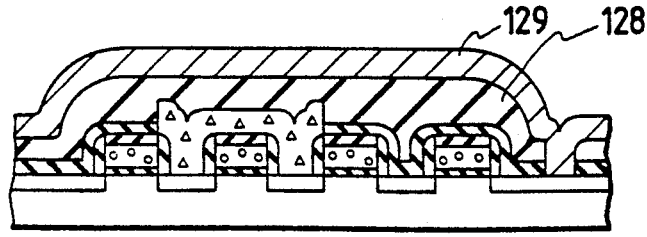
Figure 8:
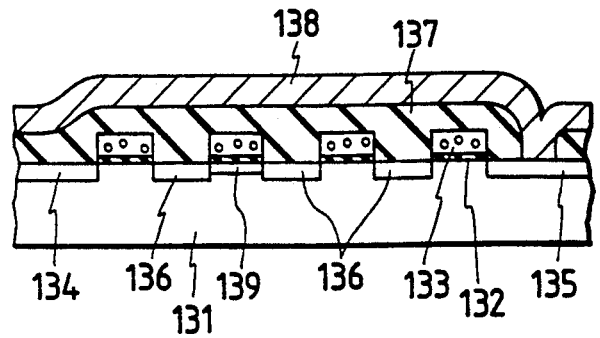
FIG. 8 is a sectional view of an example of a conventional MIS type semiconductor device.
Figure 9A:
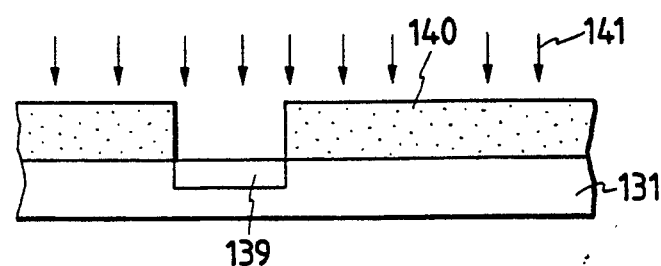
FIGS. 9(a)-(d) are a diagram for illustrating the steps of a method for fabricating a conventional MIS type semiconductor device.
Figure 9B:
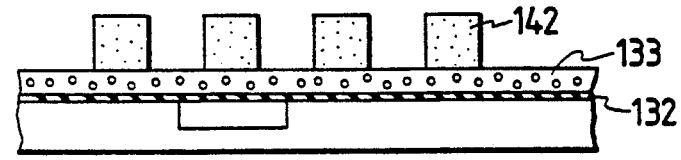
Figure 9C:
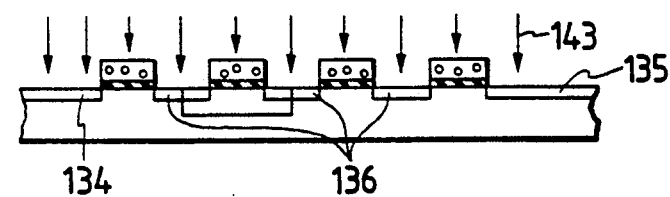
Figure 9D:
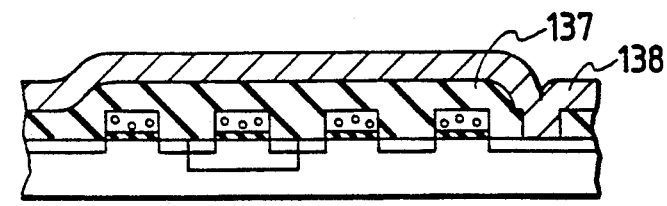

Next, as illustrated in FIG. 7(h), a portion of the conductive layer 126 is etched by using the third photoresist 127 as a mask in such a manner that the remaining portion of the conductive layer 126 is left at a position on at least two adjoining inter-gate-electrode diffusion layers and the gate electrode provided therebetween.

Thereafter, an inter-layer insulation film 128 and an aluminum wire 129 are formed.

In case of this example of the method for fabricating the MIS type semiconductor device, the same effects of the example of FIG. 6 other than the effects caused by the silicon nitride film can be obtained.

Hereinafter, another MIS type semiconductor device embodying the present invention will be described by referring to FIG. 10.

Figure 10A:
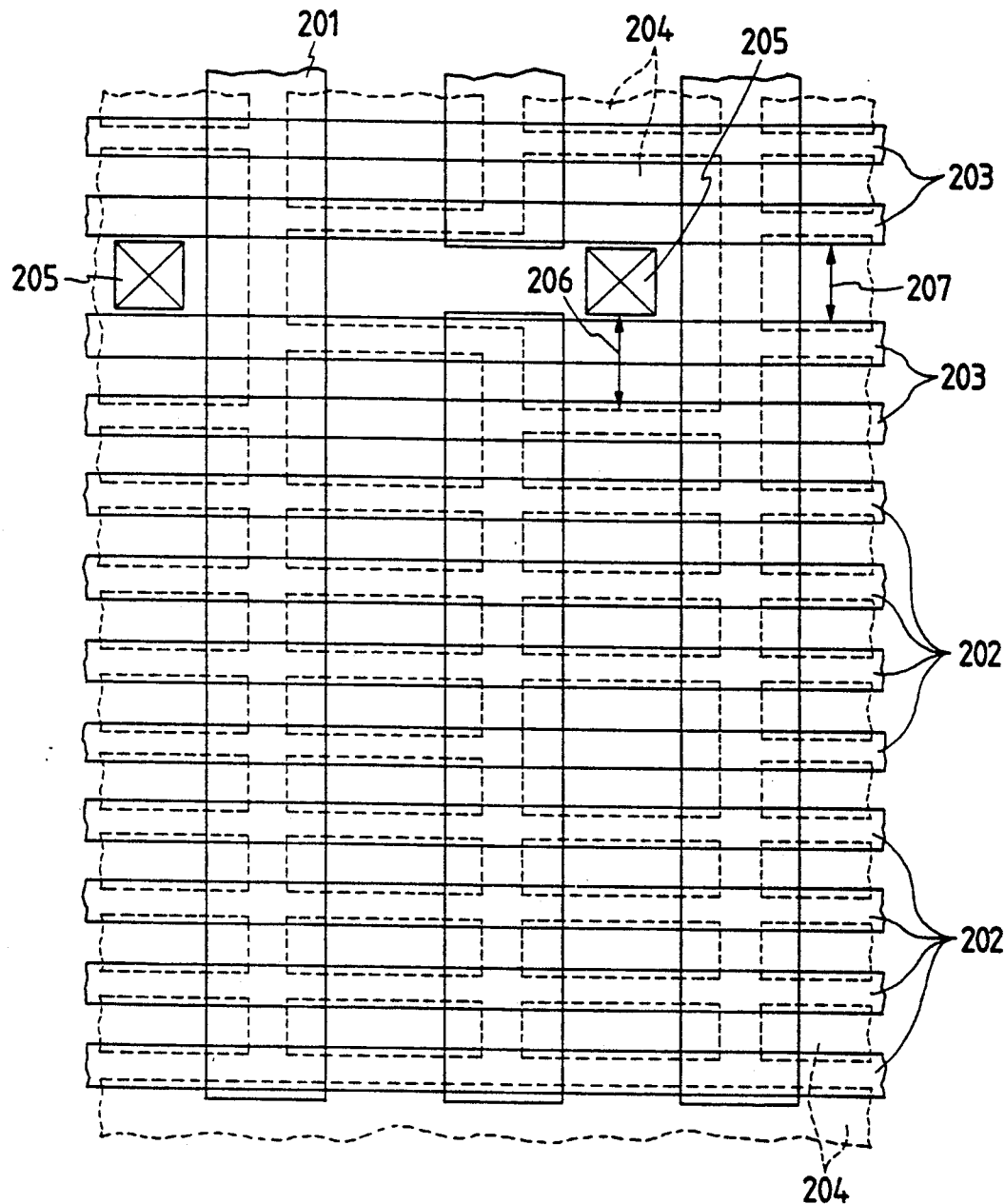
FIG. 10(a) is a plan view of layout of another semiconductor device embodying the present invention.

Referring first to FIG. 10(a), there is shown a plan view of pattern layout of this MIS type semiconductor device embodying the present invention. Incidentally, this embodiment (hereunder sometimes referred to as a second embodiment) corresponds to each of the above described fourth, fifth, sixth, seventh and ninth MIS type semiconductor devices. As shown in this figure, the primary composing elements of the layout of this semiconductor device are a device isolation region 201, a memory-cell transistor gate electrode region 202, a selection line transistor gate electrode region 203, a conductive material layer 204 and a contact pattern region 205 connected to a drain region. In this configuration, an overlapping margin 206, which is employed to form a contact, corresponds to a distance between an edge of the conductive material layer 204 and the contact pattern region 205.

Figure 11A:
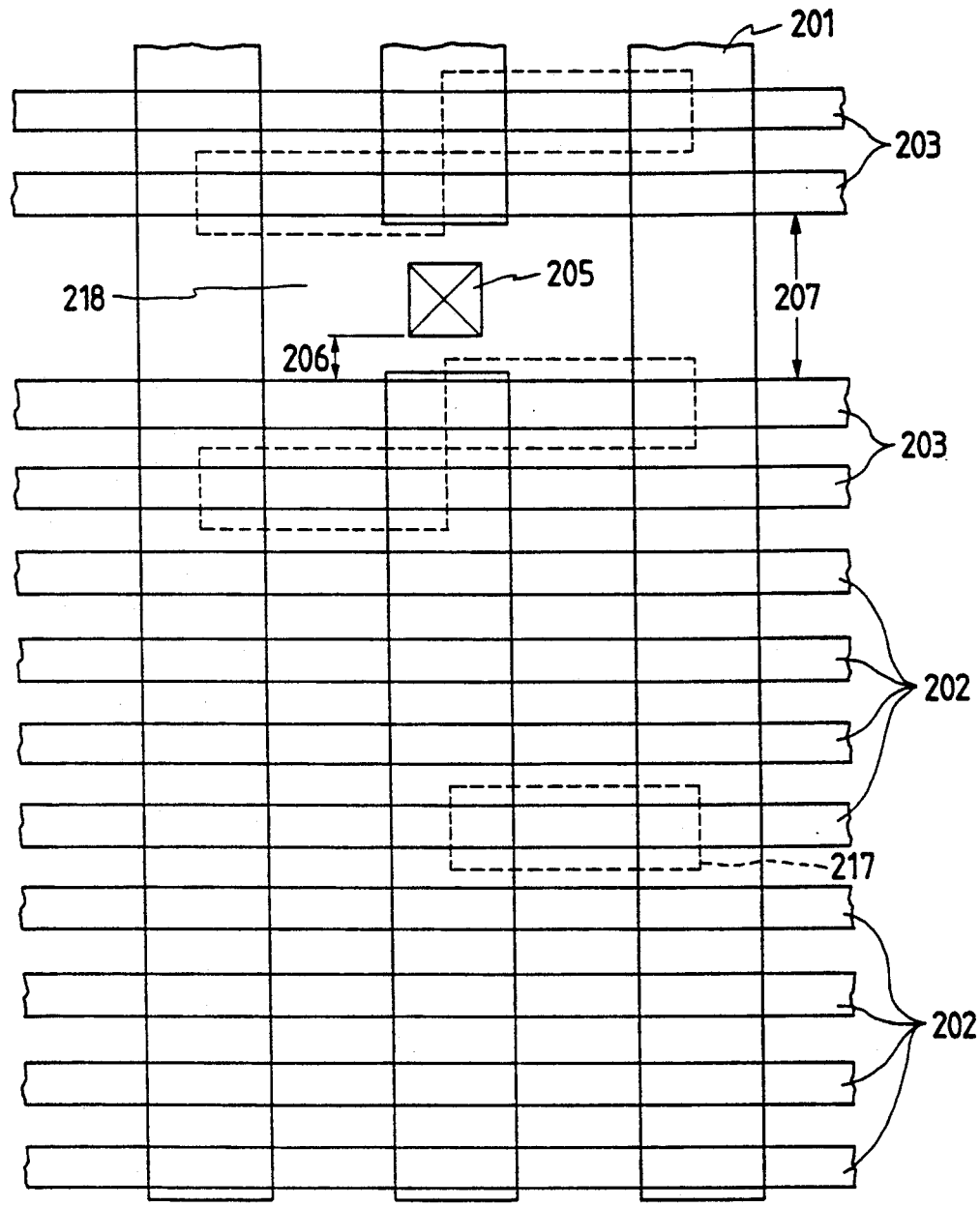
FIG. 11(a) is a plan view of a primary part of layout of another conventional semiconductor device.

Further, two pairs (namely, an upper pair and a lower pair) of selection-line transistor gate electrode regions 203 are placed above and below the contact pattern region 205, respectively, as viewed in FIG. 10(a). The distance 207 between a lower selection-line transistor gate electrode region 203 of the upper pair and an upper selection-line transistor gate electrode region 203 of the lower pair does not put restrictions on an overlap for forming a contact. Thus the distance 207 can be narrower than the conventional layout of FIG. 11(a).

As shown in FIG. 10(a), in the pattern layout, a semiconductor substrate between gate electrodes is connected to a drain region by a conductive material. Further, the drain region is covered by the conductive material layer 204, and the contact pattern region 205 is placed on the conductive material layer 204. Moreover, the drain region is provided in such a manner to intervene between portions corresponding to two DMOS transistors, which are used as selection line transistors and are aligned in the vertical direction as viewed in this figure (namely, in the direction along which a bit line extends).

FIG. 10(b) is a sectional view of a primary part of the layout of the semiconductor device of FIG. 10(a), taken on a line passing through the center of the contact pattern region 205 of FIG. 10(a).

As shown in FIG. 10(b), the semiconductor device comprises a silicon substrate 208, memory-cell transistor gate electrodes 209 and selection-line transistor gate electrodes 210 which are made of gate oxidation films and gate electrode polysilicon layers, a drain diffusion layer 211 formed in the silicon substrate 208, inter-gate-electrode diffusion layers 212, insulation films 213 formed in such a manner to cover the gate electrodes, conductive material layers 214 made of polysilicon, self-aligned silicide or the like, inter-layer insulation films 215 and an aluminum wire 216 to be used as a bit line.

The conductive material layer 214 covers the drain diffusion layer 211 and the inter-gate-electrode diffusion layer 212. Moreover, the conductive material layer 214 covers the selection-line transistor gate electrodes 210, which are close to the drain diffusion layer 211, and the inter-gate-electrode diffusion layers 212 at an upper side of an upper one of these electrodes 210 and at a lower side of a lower one thereof continuously. Furthermore, the conductive material layer 214 covers each of the memory-cell transistor gate electrodes 209 and the diffusion layers 212 at both sides of each of the electrodes 209 continuously.

Further, transistors respectively having the selection line transistor gate electrode 210 and the memory cell transistor gate electrode 209, which are covered by the conductive material layer 214, become DMOS transistors. In contrast, a transistor, the electrodes 209 and 210 of which are not covered by the conductive material layer 214, becomes an EMOS transistor. Namely, a program (or information to be stored) can be written to a read-only memory by forming the conductive material layer 214. At that time, the conductive material layer 214 used for writing the program to a contact portion of the silicon substrate 208 can serve as a spacer in the contact portion by forming the conductive material layer 214 on the drain diffusion layer 211.

Incidentally, the overlapping margin 206 used for forming a contact and the distance 207 between the selection line transistor gate electrode regions 210 are indicated in the sectional view of FIG. 10(b).

While preferred embodiments of the present invention have been described above, it is to be understood that the present invention is not limited thereto and that other modifications will be apparent to those skilled in the art without departing from the spirit of the invention. The scope of the present invention, therefore, is to be determined solely by the appended claims.

What is claimed is:

1. A semiconductor device having a source diffusion layer and a drain diffusion layer formed under a surface of a semiconductor substrate, a plurality of gate insulation films formed on the surface of the semiconductor substrate, a plurality of memory-cell transistor gate electrodes and two or more selection line transistor gate electrodes, which are formed on the plurality of gate insulation films in such a manner to be arranged in series with one another between the source diffusion layer, inter-gate-electrode diffusion layers formed under surfaces of regions of the semiconductor substrate among the plurality of the memory-cell transistor gate electrodes and the two or more selection line transistor gate electrodes, insulating side walls provided on both sides of each of the gate electrodes, conductive material layers each for covering at least one of the inter-gate-electrode diffusion layers among the plurality of the gate electrodes arranged in series with one another and covering the insulating side walls provided on said at least one of the inter-gate-electrode diffusion layers and filling a depression surrounded by the insulating side walls and said at least one of the inter-gate-electrode diffusion layers, an insulation layer for covering the gate electrodes and for covering the conductive material layers partly, and a conductive wiring layer provided on the insulation layer and in contact with a part of the conductive material layer, which part is not covered by the insulation layer, wherein the conductive material layers provided at both sides of at least one of the plurality of the gate electrodes are selectively interconnected on at least one of the plurality of the gate electrodes, wherein one of the inter-gate-electrode diffusion layers, which is provided among the two or more selection line transistor gate electrodes, is connected to the conductive material layer which covers the one of the inter-gate-electrode diffusion layers and is connected to at least one of the source and drain diffusion layers.

2. A semiconductor device having a source diffusion layer and a drain diffusion layer formed under a surface of a semiconductor substrate, a plurality of gate insulation films formed on the surface of the semiconductor substrate, a plurality of memory-cell transistor gate electrodes and two or more selection line transistor gate electrodes, which are formed on the plurality of gate insulation films in such a manner to be arranged in series with one another between the source and drain diffusion layers, inter-gate-electrode diffusion layers formed under surfaces of regions of the semiconductor substrate among the plurality of the memory-cell transistor gate electrodes and the two or more selection line transistor gate electrodes, insulating side walls provided on both sides of each of the gate electrodes, conductive material layers each for covering at least one of the inter-gate-electrode diffusion layers among the plurality of the gate electrodes arranged in series with one another and covering the insulating side walls provided on said at least one of the inter-gate-electrode diffusion layers and filling a depression surrounded by the insulating side walls and said at least one of the inter-gate-electrode diffusion layers, an insulation layer for covering the gate electrodes and for covering the conductive material layers partly, and a conductive wiring layer provided on the insulation layer and in contact with a part of the conductive material layer, which part is not covered by the insulation layer, wherein the conductive material layers provided at both sides of at least one of the plurality of the gate electrodes are selectively interconnected on at least one of the plurality of the gate electrodes, wherein the diffusion layers placed at both sides of the selection line transistor gate electrode corresponding to a selection line transistor serving as a depletion type transistor among a plurality of memory-cell transistors, each of which is comprised of the source diffusion layer, the drain diffusion layer, the inter-gate-electrode diffusion layer, the plurality of memory-cell transistor gate electrodes and the two or more selection line transistor gate electrodes, and two or more selection line transistors are covered by the conductive material layers, wherein the conductive material layers are connected to each other on the selection line transistor gate electrode corresponding to the selection line transistor serving as a depletion type transistor, and wherein portions corresponding to two depletion type transistors used as the selection line transistors, between which the source or drain diffusion layer is inserted, are aligned in the direction along which a bit line extends, wherein one of the inter-gate-electrode diffusion layers, which is provided among the two or more selection line transistor gate electrodes, is connected to the conductive material layer which covers the one of the inter-gate-electrode diffusion layers and is connected to at least one of the source and drain diffusion layers.

3. A semiconductor device having a source diffusion layer and a drain diffusion layer formed under a surface of a semiconductor substrate, a plurality of gate insulation films formed on the surface of the semiconductor substrate, a plurality of memory-cell transistor gate electrodes formed on the plurality of gate insulation films in such a manner to be arranged in series with one another between the source and drain diffusion layers, inter-gate-electrode diffusion layers formed under surfaces of regions of the semiconductor substrate among the plurality of the memory-cell transistor gate electrodes, insulating sidewalls provided on both sides of each of the gate electrodes, conductive material layers each for covering at least one of the inter-gate-electrode diffusion layers among the plurality of the gate electrodes arranged in series with one another and covering the insulating side walls provided on said at least one of the inter-gate-electrode diffusion layers and filling a depression surrounded by the insulating side walls and said at least one of the inter-gate-electrode diffusion layers, an insulation layer for covering the gate electrodes and for covering the conductive material layers partly, and a conductive wiring layer provided on the insulation layer and in contact with a part of the conductive material layer, which part is not covered by the insulation layer, wherein one of the inter-gate-electrode diffusion layers, which is provided among the two or more selection line transistor gate electrodes, is connected to the conductive material layer which covers the one of the inter-gate-electrode diffusion layers and is connected to at least one of the source and drain diffusion layers, wherein the conductive material layers provided at both sides of at least one of the plurality of the gate electrodes are selectively interconnected on at least one of the plurality of the gate electrodes, wherein among a plurality of memory-cell transistors, each of which is comprised of the source region, the drain region, the inter-gate-electrode diffusion layer and the plurality of the memory-cell transistor gate electrodes, a memory-cell transistor serves as a depletion type transistor correspondingly to a program employed for a read-only memory, wherein the diffusion layers placed at both sides of the memory-cell transistor gate electrode corresponding to the memory-cell transistor serving as the depletion type transistor are covered by the conductive material layers used for writing a program to a contact portion of the substrate corresponding to the source or drain diffusion layer, wherein the conductive material layers used for writing a program thereto are connected to each other on the memory-cell transistor gate electrode corresponding to the memory-cell transistor serving as the depletion type transistor, and wherein the conductive material layer used for writing a program to the contact portion is formed on the contact portion and is employed as a spacer.

* * * * *